(12) United States Patent
Komura

(10) Patent No.: US 11,805,706 B2
(45) Date of Patent: Oct. 31, 2023

(54) MAGNETORESISTANCE EFFECT ELEMENT AND MAGNETIC MEMORY

(71) Applicant: TDK CORPORATION, Tokyo (JP)

(72) Inventor: Eiji Komura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/192,296

(22) Filed: Mar. 4, 2021

(65) Prior Publication Data

US 2022/0285608 A1 Sep. 8, 2022

(51) Int. Cl.
*H10N 52/80* (2023.01)
*H10B 61/00* (2023.01)
*H10N 52/00* (2023.01)
*H10N 52/01* (2023.01)

(52) U.S. Cl.
CPC ............ *H10N 52/80* (2023.02); *H10B 61/22* (2023.02); *H10N 52/00* (2023.02); *H10N 52/01* (2023.02)

(58) Field of Classification Search
CPC ....... H01L 43/04; H01L 27/228; H01L 43/06; H01L 43/14; H10B 61/00; H10B 61/10; H10B 61/22; H01B 61/20; H01B 61/22; H10N 52/80; H10N 52/101; H10N 52/01; H10N 52/00; H10N 50/85; H10N 50/10
See application file for complete search history.

(56) References Cited

U.S. PATENT DOCUMENTS

| | | | |
|---|---|---|---|
| 8,350,347 B2 | 1/2013 | Gaudin et al. | |
| 10,749,196 B2 | 8/2020 | Raaheim et al. | |
| 10,756,259 B2 | 8/2020 | Ahn et al. | |
| 2015/0348606 A1 | 12/2015 | Buhrman et al. | |
| 2017/0222135 A1 | 8/2017 | Fukami et al. | |
| 2018/0268888 A1* | 9/2018 | Ohsawa | G11C 11/161 |
| 2018/0277185 A1* | 9/2018 | Shimizu | G11C 11/1675 |
| 2018/0350417 A1 | 12/2018 | Shiokawa et al. | |
| 2018/0351085 A1 | 12/2018 | Shiokawa et al. | |
| 2019/0035446 A1* | 1/2019 | Shibata | G11C 11/1675 |
| 2019/0057732 A1 | 2/2019 | Shiokawa et al. | |
| 2019/0267542 A1* | 8/2019 | Komura | H01L 43/02 |
| 2020/0006631 A1* | 1/2020 | Sato | G11C 11/161 |
| 2020/0161542 A1* | 5/2020 | Ahn | H01L 43/10 |
| 2021/0202827 A1* | 7/2021 | Song | H01L 27/224 |

(Continued)

FOREIGN PATENT DOCUMENTS

JP 6426330 B1 11/2018
WO 2016/021468 A1 2/2016

OTHER PUBLICATIONS

Y. K. Kato et al., "Observation of the Spin Hall Effect in Semiconductors," Science, vol. 306, pp. 1910-1913, (2004).

(Continued)

*Primary Examiner* — Latanya N Crawford Eason
(74) *Attorney, Agent, or Firm* — Oliff PLC

(57) ABSTRACT

A magnetoresistance effect element includes: a laminate body including a first ferromagnetic layer, a second ferromagnetic layer, and a non-magnetic layer located between the first ferromagnetic layer and the second ferromagnetic layer; and a spin-orbit torque wiring connected to the laminate body. A second surface opposite to a first surface of the spin-orbit torque wiring in contact with the laminate body is curved in a first direction orthogonal to a direction in which the laminate body is laminated.

11 Claims, 18 Drawing Sheets

(56) References Cited

U.S. PATENT DOCUMENTS

2021/0351341 A1* 11/2021 Sasaki ............... H01L 29/82
2022/0181061 A1* 6/2022 Roiz-Wilson ........ G11B 5/3909

OTHER PUBLICATIONS

I. M. Miron et al., "Perpendicular switching of a single ferromagnetic layer induced by in-plane current injection," Nature, vol. 476, pp. 189-194, (2011).

L. Liu et al., "Spin torque switching with the giant spin Hall effect of tantalum," Science, vol. 336, 555, 31 pages, (2012).

L. Liu et al., "Current-Induced Switching of Perpendicularly Magnetized Magnetic Layers Using Spin Torque from the Spin Hall Effect," Physical Review Letters, vol. 109, pp. 096602-1-096602-5, (2012).

K. S. Lee et al., "Threshold current for switching of a perpendicular magnetic layer induced by spin Hall effect," Applied Physics Letters, vol. 102, 112410, 17 pages, (2013).

K. S. Lee et al., "Thermally activated switching of perpendicular magnet by spin-orbit spin torque," Applied Physics etters, vol. 104, pp. 072413-1-072413-5, (2014).

S. Fukami et al., "Magnetization switching by spin-orbit torque in an antiferromagnet-ferromagnet bilayer system," nature materials, vol. 15, pp. 535-542 (2016).

S. Fukami et al., "A spin-orbit torque switching scheme with collinear magnetic easy axis and current configuration," nature nanotechnology, 6 pages, (2016).

S. Takahashi et al., "Spin injection and detection in magnetic nanostructures," Physical Review B, vol. 67, pp. 052409-1-052409-4, (2003).

Y. Seo et al., "Area-Efficient SOT-MRAM With a Schottky Diode," IEEE Electron Device Letters, vol. 37, No. 8, p. 982-985, (2016).

* cited by examiner

MAGNETORESISTANCE EFFECT ELEMENT AND MAGNETIC MEMORY

BACKGROUND OF THE INVENTION

Field of the Invention

The present invention relates to a magnetoresistance effect element and a magnetic memory.

Description of Related Art

Giant magnetoresistive (GMR) elements including a multilayer film formed of a ferromagnetic layer and a non-magnetic layer and tunnel magnetoresistive (TMR) elements including an insulating layer (a tunnel barrier layer or a barrier layer) used as a non-magnetic layer are known as magnetoresistance effect elements. Magnetoresistance effect elements can be applied to magnetic sensors, high-frequency components, magnetic heads, and non-volatile random access memories (MRAMs).

MRAMs are storage elements including magnetoresistance effect elements integrated therein. MRAMs read and write data using the characteristic of magnetoresistance effect elements that the resistance changes if the direction of magnetization of two ferromagnetic layers having non-magnetic layers arranged therebetween in magnetoresistance effect elements changes. The directions of magnetization of ferromagnetic layers are controlled using, for example, a magnetic field generated by an electric current. Furthermore, for example, the directions of magnetization of the ferromagnetic layers may be controlled using a spin transfer torque (STT) generated when an electric current flows in a direction in which the magnetoresistance effect elements are laminated.

When the directions of magnetization of ferromagnetic layers are rewritten using an STT, an electric current flows in a direction in which the magnetoresistance effect elements are laminated. A write current causes deterioration in the characteristics of the magnetoresistance effect elements.

In recent years, attention has been focused on methods in which an electric current does not need to flow in a direction in which a magnetoresistance effect element is laminated at the time of writing. One of the methods is a writing method in which a spin-orbit torque (SOT) is utilized. The SOT is induced due to a spin current generated due to a spin-orbit interaction or a Rashba effect at an interface between different kinds of materials. The electric current used for inducing an SOT in magnetoresistance effect elements flows in a direction intersecting a direction in which the magnetoresistance effect elements are laminated. That is to say, it is not necessary for an electric current to flow in a direction in which the magnetoresistance effect elements are laminated and thus it can be expected that the lifespan of the magnetoresistance effect elements would be extended. For example, Japanese Patent No. 6426330 discloses a magnetoresistance effect element using the SOT.

SUMMARY OF THE INVENTION (1) A magnetoresistance effect element according to a first aspect includes: a laminate body, including a first ferromagnetic layer, a second ferromagnetic layer, and a non-magnetic layer located between the first ferromagnetic layer and the second ferromagnetic layer; and a spin-orbit torque wiring connected to the laminate body, wherein a second surface opposite to a first surface of the spin-orbit torque wiring in contact with the laminate body is curved in a first direction among directions orthogonal to a direction in which the laminate body is laminated.

(2) In the magnetoresistance effect element according to the aspect, the second surface may be curved so that a center in the first direction is away from the first surface.

(3) In the magnetoresistance effect element according to the aspect, the second surface may be curved so that a center in the first direction is close to the first surface.

(4) In the magnetoresistance effect element according to the aspect, the second surface may be curved in a second direction orthogonal to the first direction.

(5) In the magnetoresistance effect element according to the aspect, the spin-orbit torque wiring may be symmetrical in the first direction with respect to a center in the first direction.

(6) In the magnetoresistance effect element according to the aspect, the second surface may be curved at a position in which the second surface and the laminate body overlap in the lamination direction.

(7) In the magnetoresistance effect element according to the aspect, a thickness of the spin-orbit torque wiring at a first end in the first direction may be 50% or more and 95% or less of a thickness of the spin-orbit torque wiring at a center in the first direction.

(8) In the magnetoresistance effect element according to the aspect, an absolute value of a difference between a thickness of the spin-orbit torque wiring at a first end in the first direction and a thickness of the spin-orbit torque wiring at a center in the first direction may be 3% or more and 30% or less of half a length of the spin-orbit torque wiring in the first direction.

(9) In the magnetoresistance effect element according to the aspect, the magnetoresistance effect element may further include: a first wiring and a second wiring connected to different positions on the second surface of the spin-orbit torque wiring.

(10) In the magnetoresistance effect element according to the aspect, a direction of a shortest distance between the second wiring and the first wiring may coincide with the first direction.

(11) In the magnetoresistance effect element according to the aspect, a shortest direction between the second wiring and the first wiring may be tilted with respect to the first direction.

(12) In the magnetoresistance effect element according to the aspect, the first wiring may extend from a portion of the first wiring connected to the second surface toward the spin-orbit torque wiring side with respect to the first surface in the lamination direction.

(13) In the magnetoresistance effect element according to the aspect, the first wiring may extend from a portion of the first wiring connected to the second surface toward the laminate body side with respect to the first surface in the lamination direction.

(14) In the magnetoresistance effect element according to the aspect, the first wiring and the second wiring may contain a magnetic material.

(15) A magnetic memory according to a second aspect includes: a plurality of the magnetoresistance effect elements according to the aspect.

DETAILED DESCRIPTION OF THE INVENTION

Figure 1:
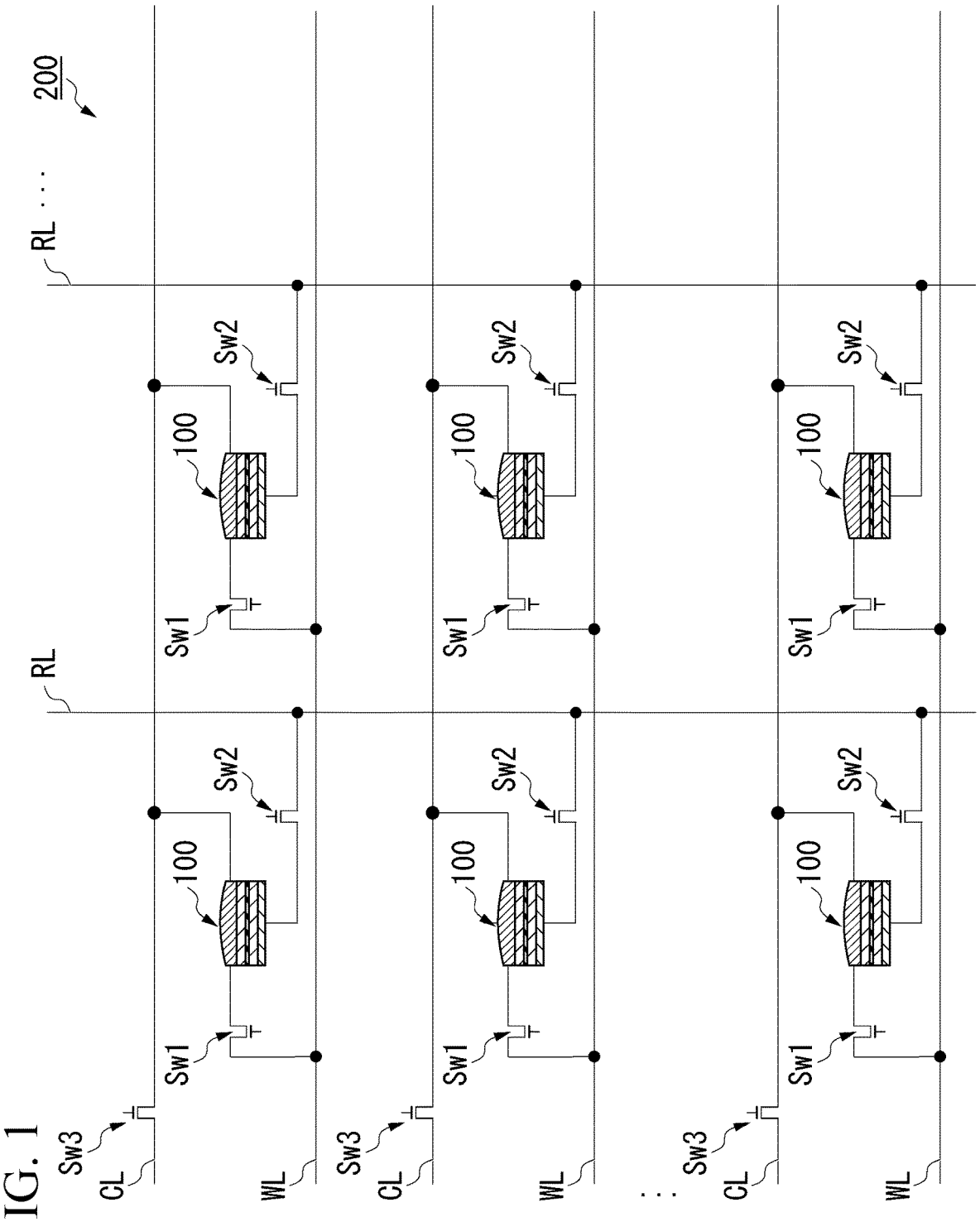
FIG. 1 is a circuit diagram of a magnetic memory according to a first embodiment.

Embodiments will be described in detail below with reference to the drawings as appropriate. In the drawings used in the following description, in order to make the characteristics easier to understand, characteristic parts may be enlarged for convenience of understanding and the dimensional ratios of respective components may differ from the actual ones in some cases. The materials, the dimensions, and the like exemplified in the following description are examples and the present invention is not limited thereto and can be appropriately modified and carried out within a range in which the effects of the present invention are exhibited.

First, directions are defined. One direction along one surface of a substrate Sub which will be described later (refer to FIG. 2) is assumed as an x direction and a direction orthogonal to the x direction is assumed as a y direction. The x direction is, for example, a direction from a first wiring 31 toward a second wiring 32. A z direction is a direction orthogonal to the x direction and the y direction. The z direction is an example of a lamination direction in which each layer is laminated. Hereinafter, a +z direction may be expressed as an "upward direction" and a −z direction may be expressed as a "downward direction" in some cases. The upward and downward directions do not necessarily coincide with a direction in which the force of gravity is applied.

The expression "extending in the x direction" mentioned in this specification means, for example, having a dimension in the x direction larger than a minimum dimension among dimensions in the x direction, the y direction, and the z direction. The same applies also in the case of the expression "extending in other directions." Furthermore, "connection" mentioned in this specification is not limited to the case of being directly connected, and also includes the case of being indirectly connected. Indirect connection may be, for example, a case in which the two layers are connected with another layer arranged between the two layers in some cases. "Connection" mentioned in this specification includes electrical connection.

First Embodiment

FIG. 1 is a diagram illustrating a constitution of a magnetic array 200 according to a first embodiment. The magnetic array 200 includes a plurality of magnetoresistance effect elements 100, a plurality of write wirings WL, a plurality of common wirings CL, a plurality of read wirings RL, a plurality of first switching elements Sw1, a plurality of second switching elements Sw2, and a plurality of third switching elements Sw3. The magnetic array 200 can be utilized for, for example, magnetic memories, and the like.

Each of the write wirings WL electrically connects a power source and one or more magnetoresistance effect elements 100. Each of the common wirings CL is a wiring utilized both when data is written and read. Each of the common wirings CL electrically connects a reference potential and one or more magnetoresistance effect elements 100. The reference potential is, for example, a ground. The common wiring CL may be provided for one of the plurality of magnetoresistance effect elements 100 or may be provided across a plurality of magnetoresistance effect elements 100. Each of the read wirings RL electrically connects the power source and one or more magnetoresistance effect elements 100. The power source is connected to the magnetic array 200 during use.

Each of the magnetoresistance effect elements 100 is connected to the first switching element Sw1, the second switching element Sw2, and the third switching element Sw3. The first switching element Sw1 is connected between the magnetoresistance effect element 100 and the write wiring WL. The second switching element Sw2 is connected between the magnetoresistance effect element 100 and the read wiring RL. The third switching element Sw3 is connected to the common wiring CL across a plurality of magnetoresistance effect elements 100.

When a prescribed first switching element Sw1 and third switching element Sw3 are turned on, a write current flows between the write wiring WL and the common wiring CL connected to a prescribed magnetoresistance effect element 100. When the write current flows, data is written to the prescribed magnetoresistance effect element 100. When a prescribed second switching element Sw2 and third switching element Sw3 are turned on, a read current flows between the common wiring CL and the read wiring RL connected to a prescribed magnetoresistance effect element 100. When the read current flows, data is read from a prescribed magnetoresistance effect element 100.

Each of the first switching elements Sw1, the second switching elements Sw2, and the third switching elements Sw3 is an element configured to control the flow of an electric current. The first switching elements Sw1, the second switching elements Sw2, and the third switching elements Sw3 are, for example, elements such as transistors and Ovonic Threshold Switches (OTS) in which a phase change of a crystal layer is utilized, elements such as metal-insulator transition (MIT) switches in which a change in band structure is utilized, elements such as Zener diodes and avalanche diodes in which a breakdown voltage is utilized, and elements whose conductivity changes due to a change in atomic position.

In the magnetic array 200 illustrated in FIG. 1, the magnetoresistance effect elements 100 connected to the same wiring share the third switching elements Sw3. The third switching element Sw3 may be provided in each of the magnetoresistance effect elements 100. Furthermore, the third switching element Sw3 may be provided in each of the magnetoresistance effect elements 100 and the first switching element Sw1 or the second switching element Sw2 may be shared by the magnetoresistance effect elements 100 connected to the same wiring.

Figure 2:
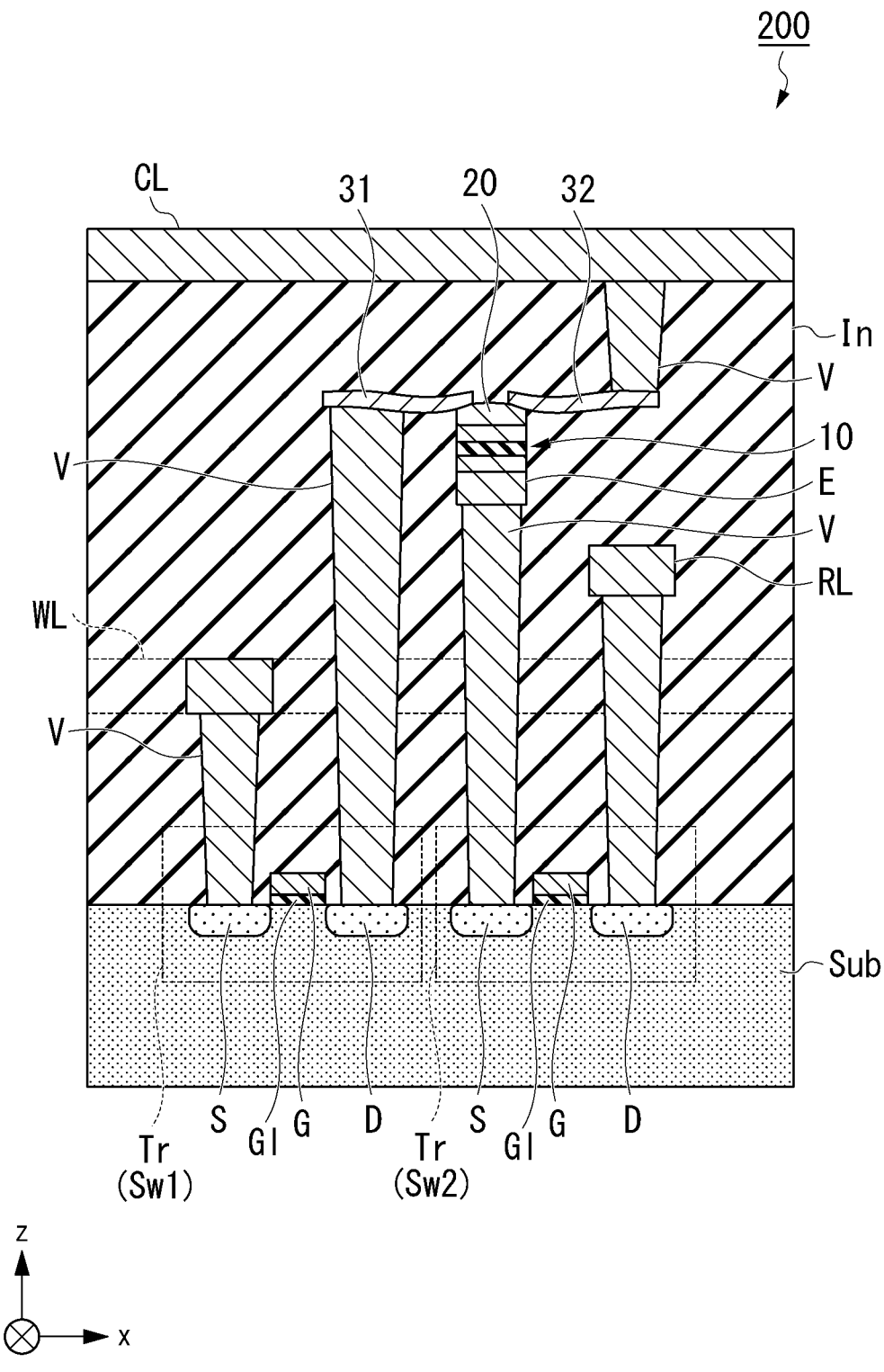
FIG. 2 is a cross-sectional view of a characteristic part of the magnetic memory according to the first embodiment.

FIG. 2 is a cross-sectional view of a characteristic part of the magnetic array 200 according to the first embodiment. FIG. 2 is a cross section of the magnetoresistance effect elements 100 cut in an xz plane passing through a center of a width of a spin-orbit torque wiring 20 which will be described later in the y direction.

The first switching element Sw1 and the second switching element Sw2 illustrated in FIG. 2 are transistors Tr. The third switching element Sw3 is electrically connected to the common wiring CL and is located, for example, at a position in which the third switching element Sw3 is deviated in the x direction of FIG. 2. Each of the transistors Tr is, for example, a field effect type transistor and includes a gate electrode G, a gate insulating film GI, and a source S and a drain D formed on the substrate Sub. The source S and the drain D are defined using a direction of flow of an electric current in advance and they are in the same region. A positional relationship between the source S and the drain D may be inverted. The substrate Sub is, for example, a semiconductor substrate.

The transistor Tr and the magnetoresistance effect element 100 are electrically connected via a via wiring V. Furthermore, the transistor Tr and the write wiring WL or the read wiring RL are connected using the via wiring V. For example, the via wiring V extends in the z direction. The via wiring V includes a material having conductivity.

The periphery of the magnetoresistance effect element 100 and the transistor Tr is covered with an insulating layer In. The insulating layer In is an insulating layer configured to insulate between the wirings of the multilayer wiring and between the elements. The insulating layer In includes, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide. ($ZrO_x$), magnesium oxide (MgO), aluminum nitride (AlN), and the like.

Figure 3:
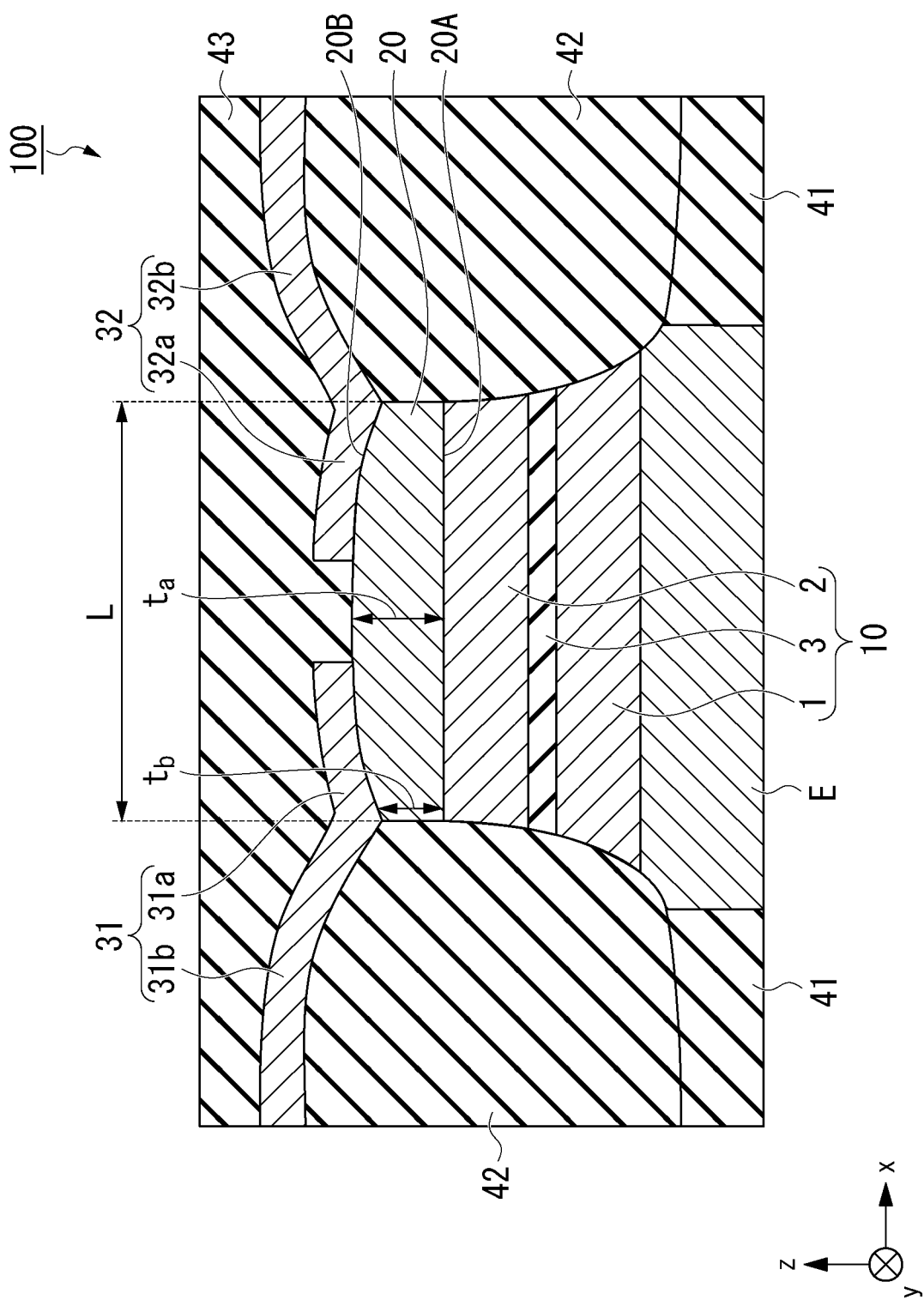
FIG. 3 is a cross-sectional view of a magnetoresistance effect element according to the first embodiment.
Figure 4:
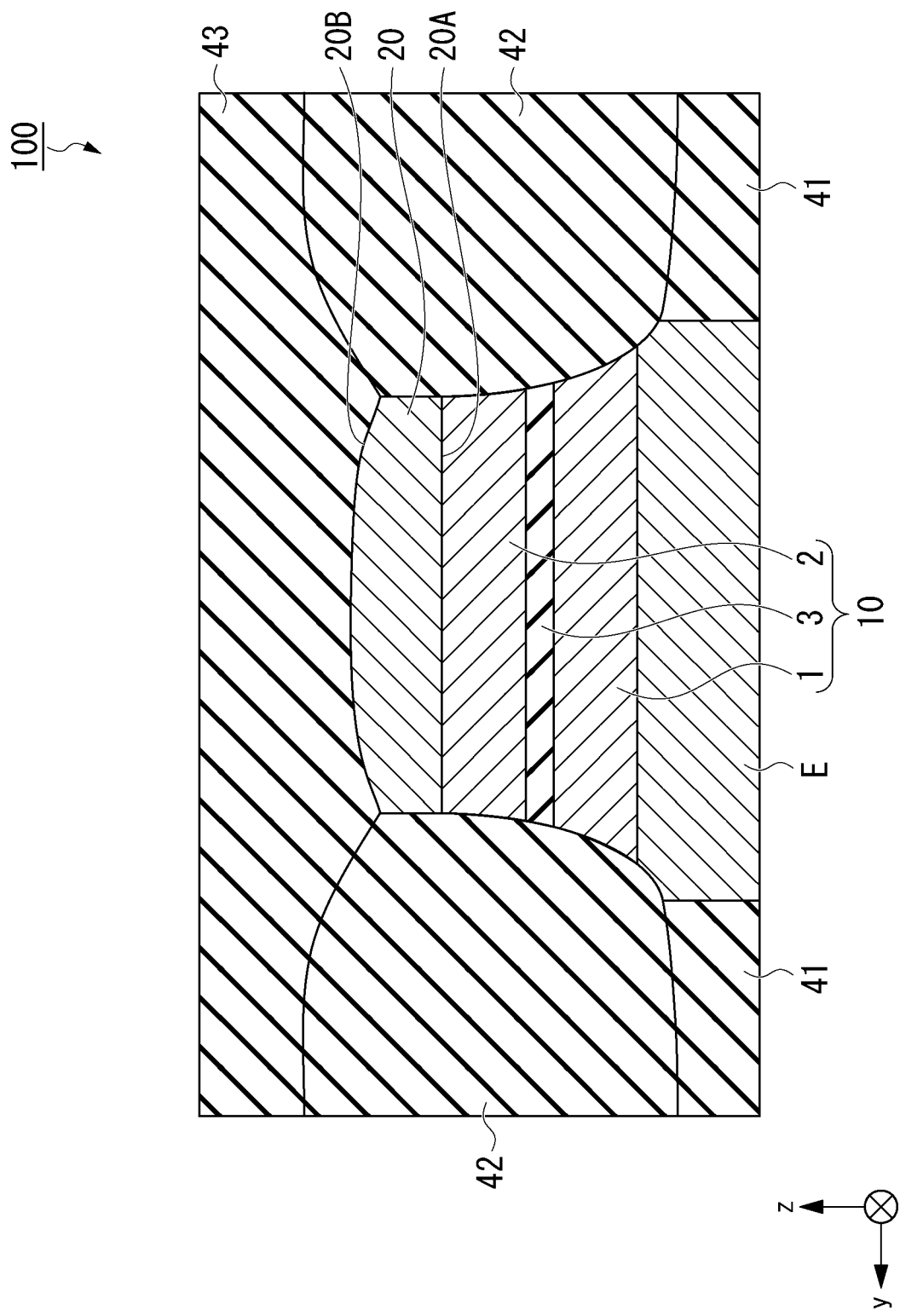
FIG. 4 is another cross-sectional view of the magnetoresistance effect element according to the first embodiment.
Figure 5:
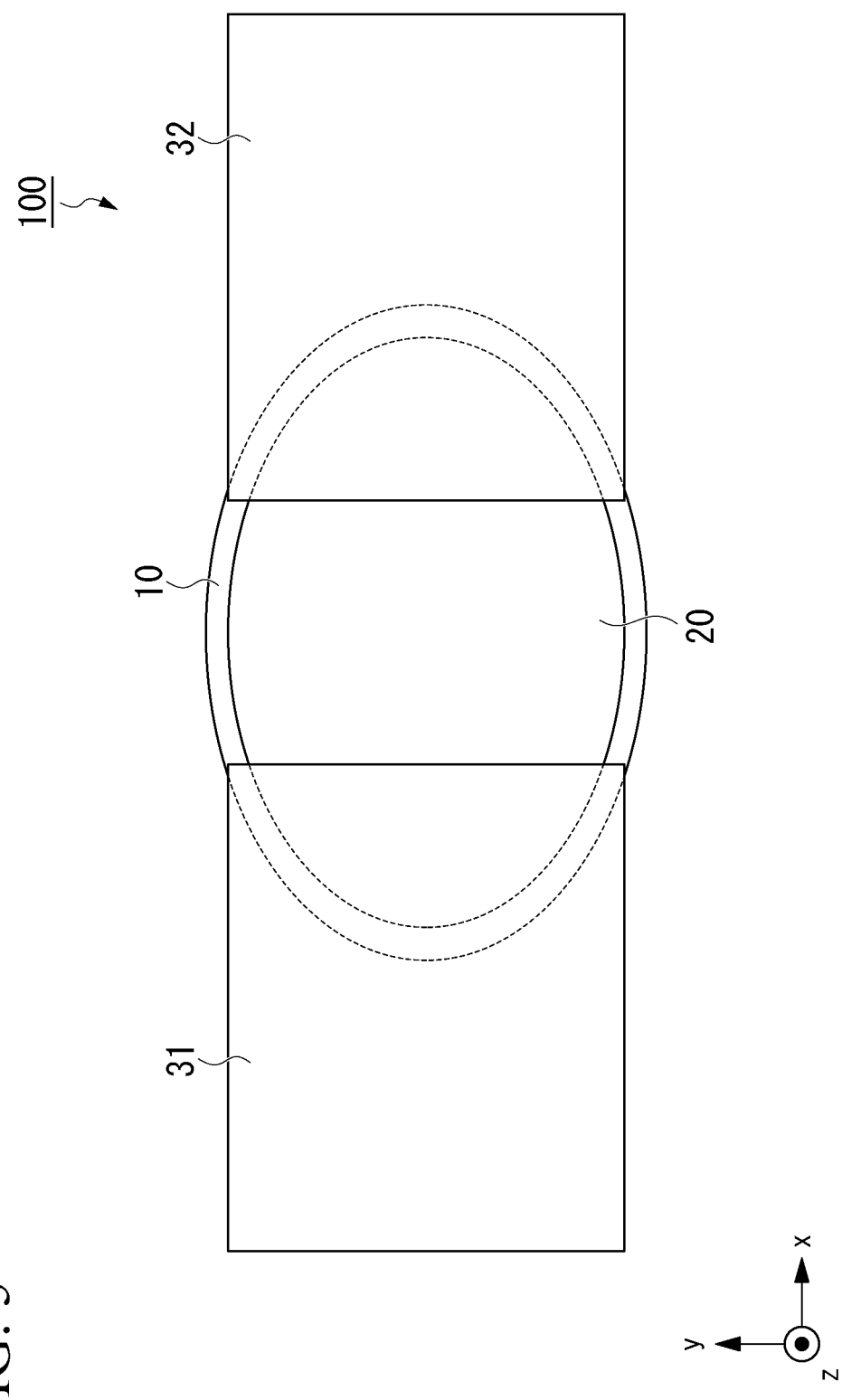
FIG. 5 is a plan view of the magnetoresistance effect element according to the first embodiment.

FIGS. 3 and 4 are cross-sectional views of the magnetoresistance effect element 100. FIG. 3 is a cross section of the magnetoresistance effect element 100 cut in an xz plane passing through a center of a width of a spin-orbit torque wiring 20 in the y direction. FIG. 4 is a cross section of the magnetoresistance effect element 100 cut in a yz plane passing through a center of a width of the spin-orbit torque wiring 20 in the x direction. FIG. 5 is a diagram of a conductive part of the magnetoresistance effect element 100 when viewed from the z direction in plan view.

The magnetoresistance effect element 100 includes, for example, a laminate body 10, the spin-orbit torque wiring 20, the first wiring 31, the second wiring 32, and an electrode E.

The periphery of the magnetoresistance effect element 100 is covered with insulating layers 41, 42, and 43. The insulating layers 41, 42, and 43 are a part of the insulating layer In described above. The periphery of the electrode E is covered with the insulating layer 41. The periphery of the laminate body 10 and the spin-orbit torque wiring 20 is covered with the insulating layer 42. Upper surfaces of the first wiring 31 and the second wiring 32 are covered with the insulating layer 43.

A resistance value of the laminate body 10 in the z direction changes when spins are injected from the spin-orbit torque wiring 20 to the laminate body 10. The magnetoresistance effect element 100 is a magnetic element in which a spin-orbit torque (SOT) is utilized and may be referred to as a "spin-orbit torque type magnetoresistance effect element," a "spin injection type magnetoresistance effect element," or a "spin current magnetoresistance effect element."

The laminate body 10 is arranged between the spin-orbit torque wiring 20 and the electrode E in the z direction. The laminate body 10 is a columnar body. A shape of the laminate body 10 when viewed from the z direction in plan view is, for example, an ellipse, a circle, or a quadrangle.

The laminate body 10 includes, for example, a first ferromagnetic layer 1, a second ferromagnetic layer 2, and a non-magnetic layer 3. The laminate body 10 includes the first ferromagnetic layer 1, the non-magnetic layer 3, and the second ferromagnetic layer 2 laminated in this order from a side close to the substrate Sub.

The second ferromagnetic layer 2 is in contact with, for example, the spin-orbit torque wiring 20. Spins are injected from the spin-orbit torque wiring 20 to the second ferromagnetic layer 2. The spin-orbit torque (SOT) is applied to the magnetization of the second ferromagnetic layer 2 by the injected spins, and an orientation direction of the magnetization changes. The first ferromagnetic layer 1 is located above the electrode E. The first ferromagnetic layer 1 and the second ferromagnetic layer 2 have the non-magnetic layer 3 arranged therebetween in the z direction.

The first ferromagnetic layer 1 and the second ferromagnetic layer 2 each have magnetization. An orientation direction of the magnetization of the first ferromagnetic layer 1 changes less easily compared with that due to the magnetization of the second ferromagnetic layer 2 when a prescribed external force is applied. The second ferromagnetic layer 2 may be referred to a "magnetization free layer" and the first ferromagnetic layer 1 may be referred to as a "magnetization fixed layer" or a "magnetization reference layer" in some cases. The laminate body 10 illustrated in FIG. 3 includes the magnetization fixed layer on the substrate Sub side and is referred to as a "bottom pin structure." A resistance value of the laminate body 10 changes in accordance with a difference between relative angles of the magnetizations of the first ferromagnetic layer 1 and the second ferromagnetic layer 2 having the non-magnetic layer 3 disposed therebetween.

The resistance value of the laminate body 10 in the z direction changes in accordance with a change between relative angles of the magnetization of the first ferromagnetic layer 1 and the magnetization of the second ferromagnetic layer. Here, although an example in which the first ferromagnetic layer 1 is the magnetization fixed layer and the second ferromagnetic layer 2 is the magnetization free layer has been exemplified, both of the first ferromagnetic layer 1 and the second ferromagnetic layer 2 may be magnetization free layers.

The first ferromagnetic layer 1 and the second ferromagnetic layer 2 include a ferromagnetic material. The ferromagnetic material is, for example, a metal selected from the group consisting of Cr, Mn, Co, Fe, and Ni, an alloy including one or more of these metals, an alloy including these metals and at least one or more elements of B, C, and N, or the like. Examples of the ferromagnetic material include Co—Fe, Co—Fe—B, Ni—Fe, Co—Ho alloys, Sm—Fe alloys, Fe—Pt alloys, Co—Pt alloys, and CoCrPt alloys.

The first ferromagnetic layer 1 and the second ferromagnetic layer 2 may include a Heusler alloy. The Heusler alloy includes an intermetallic compound having a chemical composition of XYZ or $X_2YZ$. X represents a Co-, Fe-, Ni-, or Cu-group transition metal element or a noble metal element in the periodic table, Y represents a Mn-, V-, Cr-, or Ti-group transition metal or an element of the X type, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The Heusler alloy has a high spin polarizability.

The non-magnetic layer 3 contains a non-magnetic material. When the non-magnetic layer 3 is an insulator (when the non-magnetic layer 3 is a tunnel barrier layer), as the material, for example, $Al_2O_3$, $SiO_2$, MgO, $MgAl_2O_4$, and the like can be utilized. Furthermore, in addition to these, a material in which a part of Al, Si, and Mg is replaced with Zn, Be, or the like can also be utilized. Among these, MgO and $MgAl_2O_4$ are materials in which a coherent tunnel can be realized so that spins can be efficiently injected. When the non-magnetic layer 3 is a metal, Cu, Au, Ag, or the like can be utilized as the material. In addition, when the non-magnetic layer 3 is a semiconductor, Si, Ge, $CuInSe_2$, $CuGaSe_2$, $Cu(In, Ga)Se_2$, and the like can be utilized as the material.

The laminate body 10 may include a layer other than the first ferromagnetic layer 1, the second ferromagnetic layer 2, and the non-magnetic layer 3. For example, an underlayer may be provided between the electrode E and the first ferromagnetic layer 1. The underlayer enhances the crystallinity of each layer constituting the laminate body 10. Furthermore, for example, a cap layer may be provided on the uppermost surface of the laminate body 10.

The first ferromagnetic layer 1 may be a synthetic antiferromagnetic structure (an SAF structure) composed of two magnetic layers having a spacer layer arranged therebetween. A coercive force of the first ferromagnetic layer 1 increases due to the two ferromagnetic layers which are antiferromagnetically coupled. The spacer layer contains, for example, at least one selected from the group consisting of Ru, Ir, and Rh.

The spin-orbit torque wiring 20 is a wiring through which an electrical current flows at the time of writing. A write current flows through the spin-orbit torque wiring 20 in the x direction. The spin-orbit torque wiring 20 is located above the laminate body 10.

The spin-orbit torque wiring 20 generates a spin current due to the spin Hall effect when an electric current flows and injects spins to the second ferromagnetic layer 2. The spin-orbit torque wiring 20 provides, for example, a spin-orbit torque (SOT) sufficient to reverse the magnetization of the second ferromagnetic layer 2 to the magnetization of the second ferromagnetic layer 2. The spin Hall effect is a phenomenon in which a spin current is induced in a direction orthogonal to a direction in which an electric current flows on the basis of the spin-orbit interaction when the electric current has flowed. The spin Hall effect is common to the normal Hall effect in that a moving (traveling) direction of moving (traveling) electric charges (electrons) can bend. In the normal Hall effect, the direction of motion of charged particles moving in a magnetic field is bent due to the Lorentz force. On the other hand, in the spin Hall effect, even in the absence of a magnetic field, the direction of spin movement is bent due to only the movement of electrons (only the flow of an electric current).

For example, when an electric current flows through the spin-orbit torque wiring 20, a first spin oriented in one direction and a second spin oriented in a direction opposite to that of the first spin bend due the spin Hall effect in directions orthogonal to a direction in which the electric current flows. For example, the first spin oriented in a −y direction bends in the +z direction and the second spin oriented in a +y direction bends in the −z direction.

In a non-magnetic material (a material which is not a ferromagnetic material), the number of electrons in the first spin and the number of electrons in the second spin generated due to the spin Hall effect are the same. That is to say, the number of electrons in the first spin directed in the +z direction and the number of electrons in the second spin directed in the −z direction are the same. The first spin and the second spin flow in a direction in which the uneven distribution of spins is eliminated. In the movement of the first spin and the second spin in the z direction, since the flows of electric charges cancel each other out, an amount of electric current is zero. A spin current without an electric current is particularly called a pure spin current.

If a flow of electrons in the first spin is represented as $J_\uparrow$, a flow of electrons in the second spin is represented as $J_\downarrow$, and a spin current is represented as $J_S$, they are defined as $J_S = J_\uparrow - J_\downarrow$. The spin current $J_S$ occurs in the z direction. The second spin is injected from the spin-orbit torque wiring 20 to the second ferromagnetic layer 2.

The spin-orbit torque wiring 20 includes any one of a metal, an alloy, an intermetallic compound, a metal boride, a metal carbide, a metal silicide, and a metal phosphide having a function of generating a spin flow due to the spin Hall effect when an electric current flows.

The spin-orbit torque wiring 20 contains, for example, a non-magnetic heavy metal as a main element. The main element is an element having the highest proportion among the elements constituting the spin-orbit torque wiring 20. The spin-orbit torque wiring 20 contains, for example, a heavy metal having a specific gravity of yttrium (Y) or more. Since the non-magnetic heavy metal has a large atomic number of 39 or more and has d-electrons or f-electrons in the outermost shell, strong spin-orbit interaction is generated. The spin Hall effect occurs due to the spin-orbit interaction, spins are easily unevenly distributed in the spin-orbit torque wiring 20, and a spin current $J_S$ is easily generated. The spin-orbit torque wiring 20 contains, for example, any one selected from the group consisting of Au, Hf, Mo, Pt, W, and Ta.

The spin-orbit torque wiring 20 may contain a magnetic metal. The magnetic metal is a ferromagnetic metal or an antiferromagnetic metal. A small amount of magnetic metal contained in the non-magnetic material becomes a spin scattering factor.

The small amount is, for example, 3% or less of the total molar ratio of the elements constituting the spin-orbit torque wiring 20. If the spins are scattered due to the magnetic metal, the spin-orbit interaction is enhanced and the efficiency of spin current generation with respect to an electric current increases.

The spin-orbit torque wiring 20 may include a topological insulator. The topological insulator is a substance in which the inside of the substance is an insulator or a high resistor, and a metallic state in which spin polarization occurs on a surface. In the topological insulator, an internal magnetic field occurs due spin-orbit interaction. The topological insulator develops a new topological phase due to the effect of spin-orbit interaction even in the absence of an external magnetic field. The topological insulator can generate a pure spin current with high efficiency due to strong spin-orbit interaction and breaking of inversion symmetry at the edges.

Examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. The topological insulator can generate a spin current with high efficiency.

An upper surface 20B of the spin-orbit torque wiring 20 is curved in the x direction. The upper surface 20B is a surface of the spin-orbit torque wiring 20 opposite to a lower surface 20A on the laminate body 10 side. The upper surface 20B is an example of a second surface and the lower surface 20A is an example of a first surface. The curvature of the upper surface 20B enhances the heat dissipation of the spin-orbit torque wiring 20. Furthermore, the curvature of the upper surface 20B can increase an area of the upper surface 20B coming into contact with the first wiring 31 and the second wiring 32 which will be described later. By increasing a contact area between the first wiring 31 or the second wiring 32 and the spin-orbit torque wiring 20, the contact resistance between these is reduced and the adhesion is improved.

For example, the upper surface 20B is curved in the x direction at a position in which the upper surface 20B and the laminate body 10 overlap in the z direction. The upper surface 20B is curved in a dome shape so that a center in the x direction is away from the lower surface 20A. A thickness of the spin-orbit torque wiring 20 varies depending on a position in the x direction. For example, a thickness $t_a$ of the spin-orbit torque wiring 20 at a center of the spin-orbit torque wiring 20 in the x direction is thicker than a thickness $t_b$ of the spin-orbit torque wiring 20 at a first end of the spin-orbit torque wiring 20. The thickness $t_b$ is, for example, 50% or more and 95% or less of the thickness $t_a$.

If the thickness $t_b$ of an end portion of the spin-orbit torque wiring 20 is thin, the write efficiency of the magnetoresistance effect element 100 increases. A write current flows through the spin-orbit torque wiring 20 in a +x direction or a −x direction. Spins are injected into the second ferromagnetic layer 2 in order from an end portion in the x direction. An amount of spins to be injected into the second ferromagnetic layer 2 depends on a current density of a write current flowing through the spin-orbit torque wiring 20. If the current density of the write current at the end portion of the spin-orbit torque wiring 20 is high, in an initial stage in which spins are injected into the second ferromagnetic layer 2, the amount of spins to be injected into the second ferromagnetic layer 2 increases. As a result, a trigger is created for the magnetization reversal of the second ferromagnetic layer 2 and the write efficiency of the magnetoresistance effect element 100 is improved.

Also, a portion of the spin-orbit torque wiring 20 in which a thickness is thin easily generates heat. When a thickness of the thickness $t_b$ is maintained within a prescribed range, local heat generation can be minimized. Furthermore, when a portion in which heat is easily generated is brought into contact with the first wiring 31 and the second wiring 32 having excellent heat dissipation, the heat dissipation of the magnetoresistance effect element 100 is improved.

For example, the upper surface 20B is symmetrical in the x direction with respect to the center of the spin-orbit torque wiring 20 in the x direction. If the spin-orbit torque wiring 20 is symmetrical in the x direction, the ease of writing data can be made constant regardless of whether a write current flows in the +x direction or the −x direction. That is to say, the amounts of energy required are substantially the same regardless of whether data is rewritten from "1" to "0" and when data is rewritten from "0" to "1."

Also, an absolute value of a difference between the thickness $t_a$ and the thickness $t_b$ is, for example, 3% or more and 30% or less of half a length L of the spin-orbit torque wiring 20 in the x direction. A ratio of the difference between the thickness $t_a$ and the thickness $t_b$ to half the length L of the spin-orbit torque wiring 20 in the x direction corresponds to the inclination of a line connecting one end of the upper surface to the center of the spin-orbit torque wiring 20. When the inclination is within a prescribed range, local heat generation in the spin-orbit torque wiring 20 can be minimized and the contact area with the first wiring 31 and the second wiring 32 can be increased.

As illustrated in FIG. 4, the upper surface 20B of the spin-orbit torque wiring 20 may be curved in the y direction. The upper surface 20B is, for example, curved in a dome shape in the y direction. The curvature of the upper surface 20B enhances the heat dissipation of the spin-orbit torque wiring 20.

The first wiring 31 and the second wiring 32 are connected to the spin-orbit torque wiring 20. The first wiring 31 and the second wiring 32 are connected to different positions on the upper surface 20B of the spin-orbit torque wiring 20. For example, the first wiring 31 and the second wiring 32 are connected to two end portions of the spin-orbit torque wiring 20 in the x direction. The shortest direction between the first wiring 31 and the second wiring 32 coincides with, for example, a direction in which the spin-orbit torque wiring 20 curves. The shortest direction is a direction in which a line segment connecting the shortest distance between the first wiring 31 and the second wiring 32 extends.

The first wiring 31 has a first portion 31a and a second portion 31b.

The first portion 31a is a portion of the first wiring 31 in contact with the upper surface 20B of the spin-orbit torque wiring 20. Since the first portion 31a is in contact with the upper surface 20B of the spin-orbit torque wiring 20 to be curved, it is possible to secure a wide contact area.

The second portion 31b is a portion other than the first portion 31a. The second portion 31b extends toward the spin-orbit torque wiring 20 side in the z direction with respect to the lower surface 20A of the spin-orbit torque wiring 20. The second portion 31b extends upward from, for example, the first portion 31a. If the second portion 31b extends upward, a current magnetic field accompanying a write current is not easily applied to the second ferromagnetic layer 2 as noise and it is possible to minimize an increase in a write error rate of the magnetoresistance effect element 100.

The second wiring 32 has a first portion 32a and a second portion 32b.

The first portion 32a is a portion of the second wiring 32 in contact with the upper surface 20B of the spin-orbit torque wiring 20. Since the first portion 32a is in contact with the upper surface 20B of the spin-orbit torque wiring 20 to be curved, it is possible to secure a wide contact area.

The second portion 32b is a portion other than the first portion 32a. The second portion 32b extends toward the spin-orbit torque wiring 20 side in the z direction with respect to the lower surface 20A of the spin-orbit torque wiring 20. That is to say, the second portion 32b extends upward from the first portion 32a. If the second portion 32b extends upward, a current magnetic field accompanying a write current is not easily applied to the second ferromagnetic layer 2 as noise and it is possible to minimize an increase in write error rate of the magnetoresistance effect element 100.

The first wiring 31 and the second wiring 32 contain a material having excellent conductivity. The first wiring 31 and the second wiring 32 are made of, for example, Al or Cu. The first wiring 31 and the second wiring 32 may contain a magnetic material. If the first wiring 31 or the second wiring 32 contains a magnetic material, the leakage magnetic field from the first wiring 31 or the second wiring 32 is applied to the second ferromagnetic layer 2. The leakage magnetic field facilitates the magnetization reversal of the second ferromagnetic layer 2.

A method for producing the magnetoresistance effect element 100 will be described below. The magnetoresistance effect element 100 is formed through a laminating step of each layer and a processing step of processing a part of each layer to have a prescribed shape. For the lamination of each layer, a sputtering method, a chemical vapor deposition (CVD) method, an electron beam vapor deposition method (an EB vapor deposition method), an atomic laser deposit method, or the like can be utilized. The processing of each layer can be performed using photolithography or the like.

Figure 6:
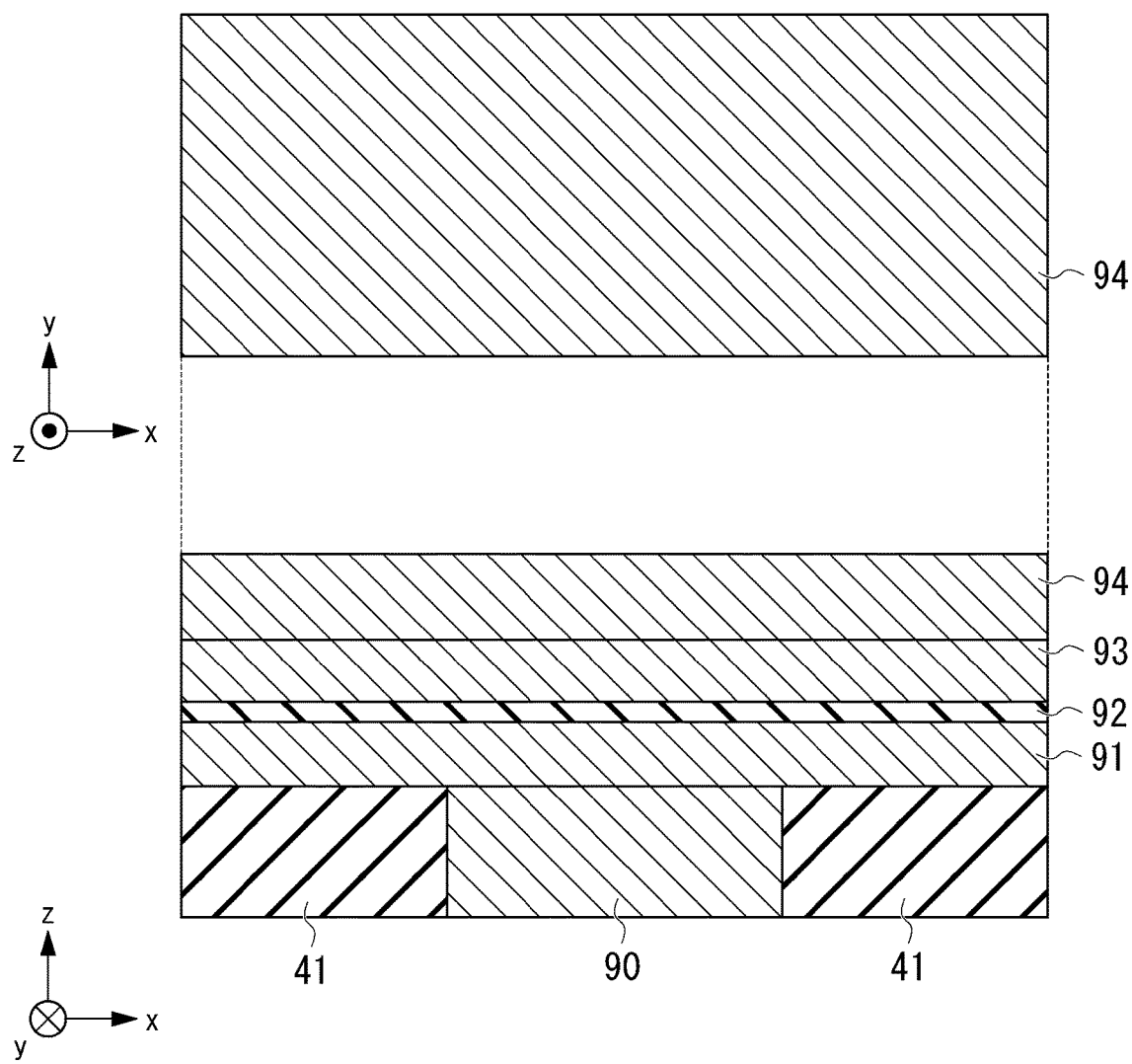
FIG. 6 is a diagram illustrating an example of a method for producing a magnetoresistance effect element according to the first embodiment.

As illustrated in FIG. 6, a ferromagnetic layer 91, a non-magnetic layer 92, a ferromagnetic layer 93, and a metal layer 94 are laminated in this order above a metal layer 90 and the insulating layer 41.

Figure 7:
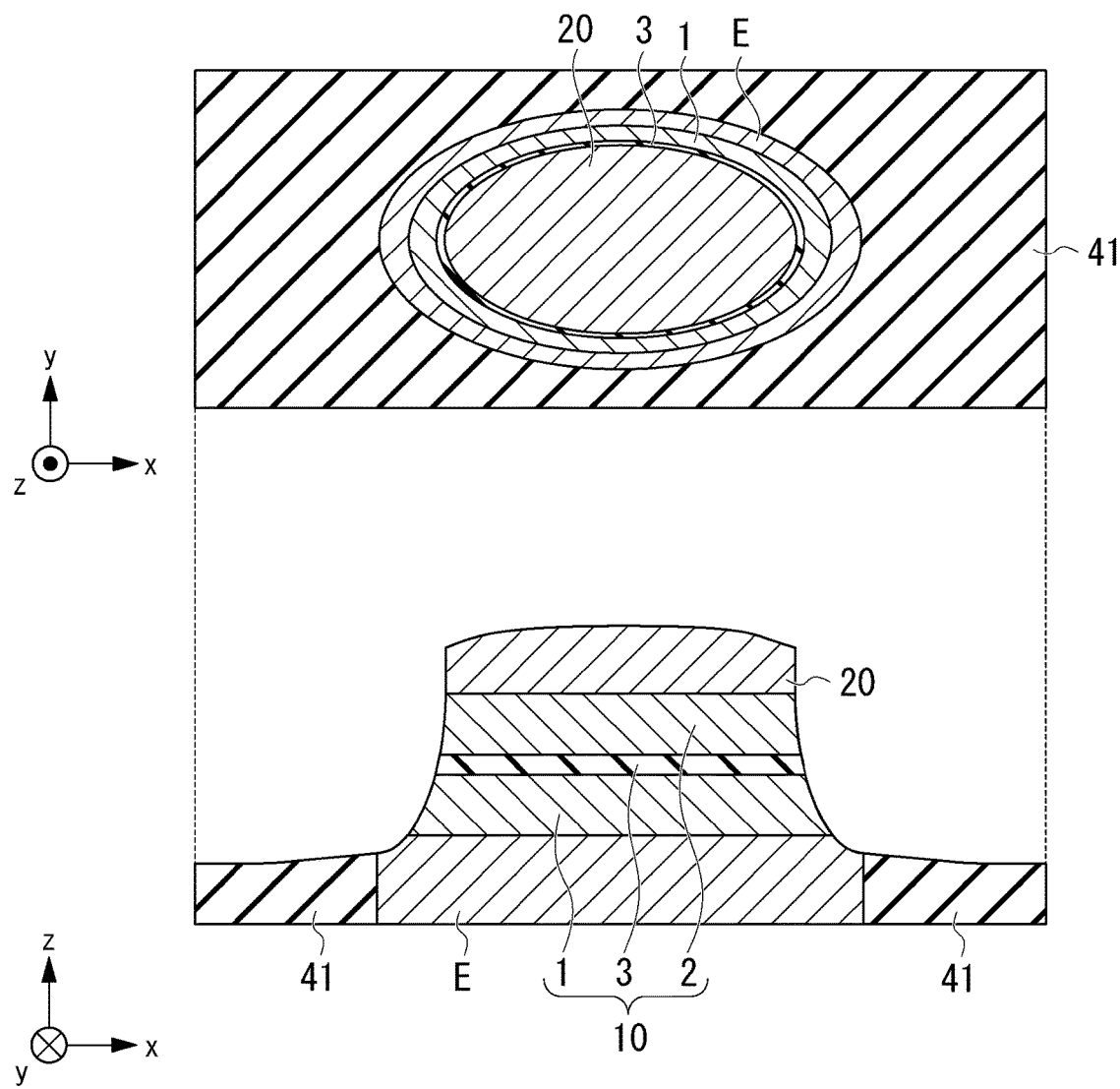
FIG. 7 is a diagram illustrating an example of a method for producing a magnetoresistance effect element according to the first embodiment.

Subsequently, as illustrated in FIG. 7, unnecessary portions of the ferromagnetic layer 91, the non-magnetic layer 92, the ferromagnetic layer 93, and the metal layer 94 are removed. The unnecessary portions are removed, for example, through etching using a mask. The etching is performed, for example, using an ion beam or the like.

A part of an upper portion of the metal layer 90 is cut off to become the electrode E. The ferromagnetic layer 91 serves as the first ferromagnetic layer 1. The non-magnetic layer 92 serves as the non-magnetic layer 3. The ferromagnetic layer 93 serves as the second ferromagnetic layer 2. The metal layer 94 serves as the spin-orbit torque wiring 20. The upper surface of the spin-orbit torque wiring 20 is curved through etching.

Figure 8:
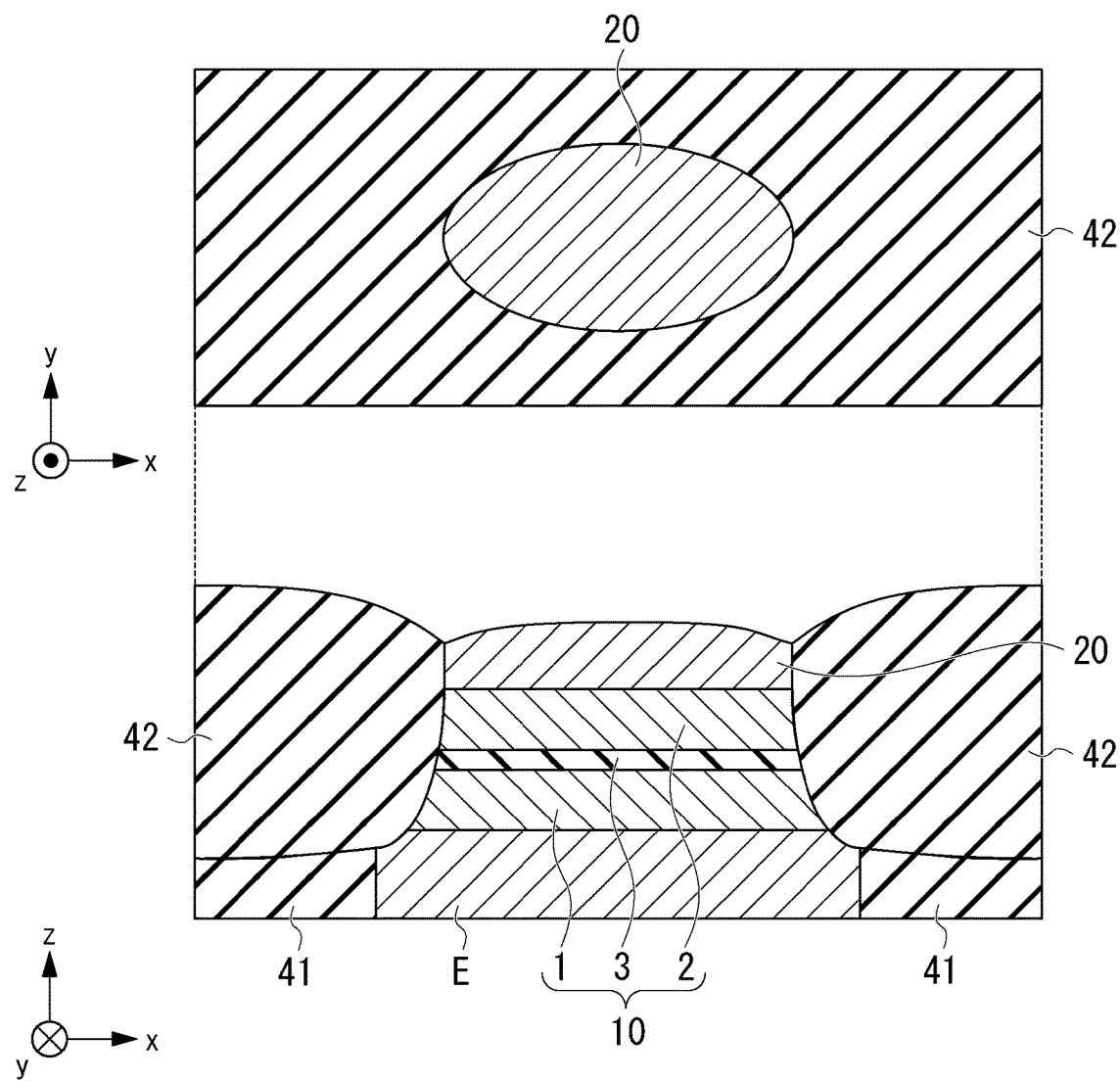
FIG. 8 is a diagram illustrating an example of a method for producing a magnetoresistance effect element according to the first embodiment.

Subsequently, as illustrated in FIG. 8, the upper surface of the spin-orbit torque wiring 20 is masked and a side surface of the laminate body 10 and an upper portion of the insulating layer 41 are covered with the insulating layer 42.

Figure 9:
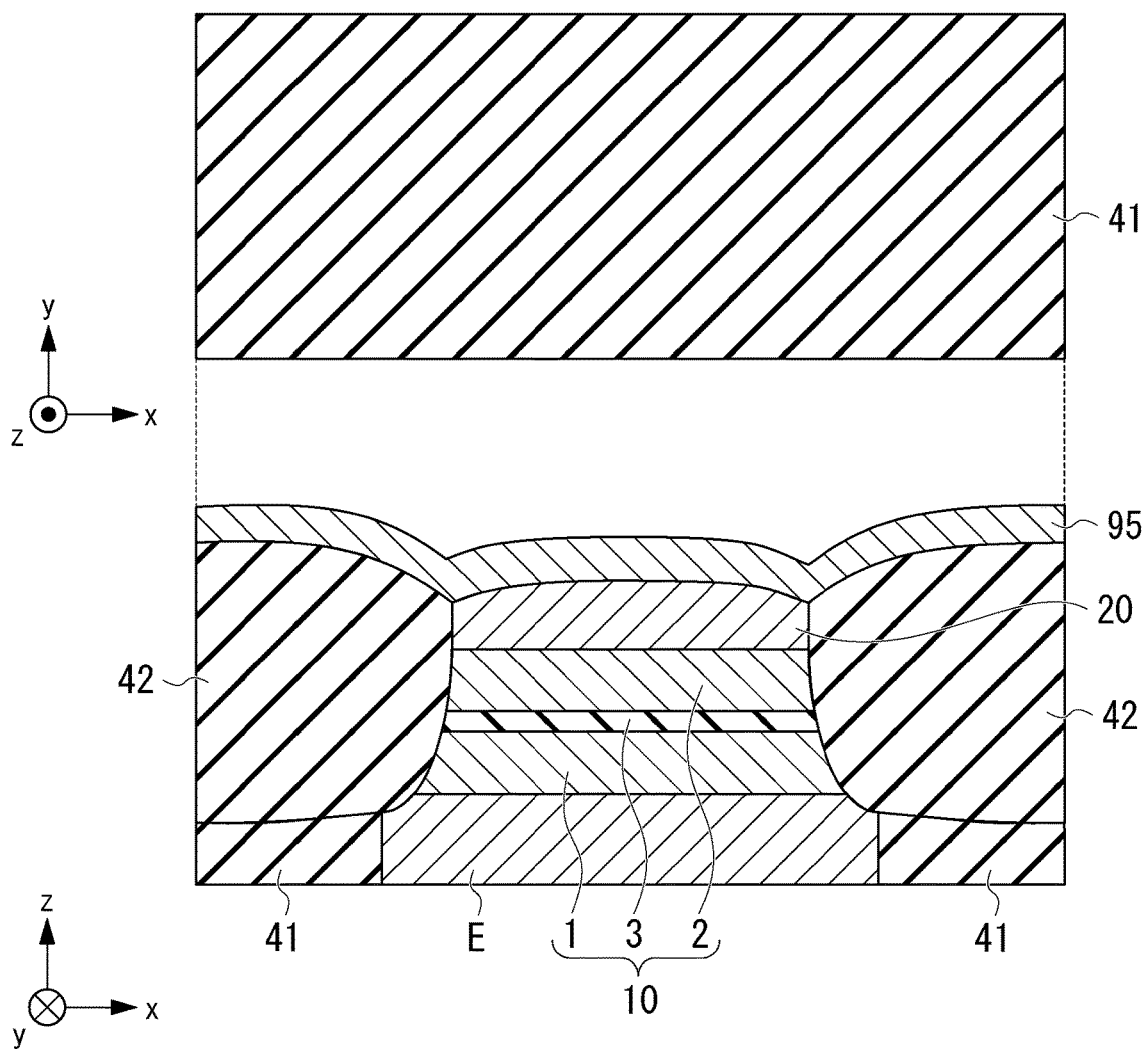
FIG. 9 is a diagram illustrating an example of a method for producing a magnetoresistance effect element according to the first embodiment.

Subsequently, as illustrated in FIG. 9, a metal layer 95 is formed above the spin-orbit torque wiring 20 and the insulating layer 42.

Figure 10:
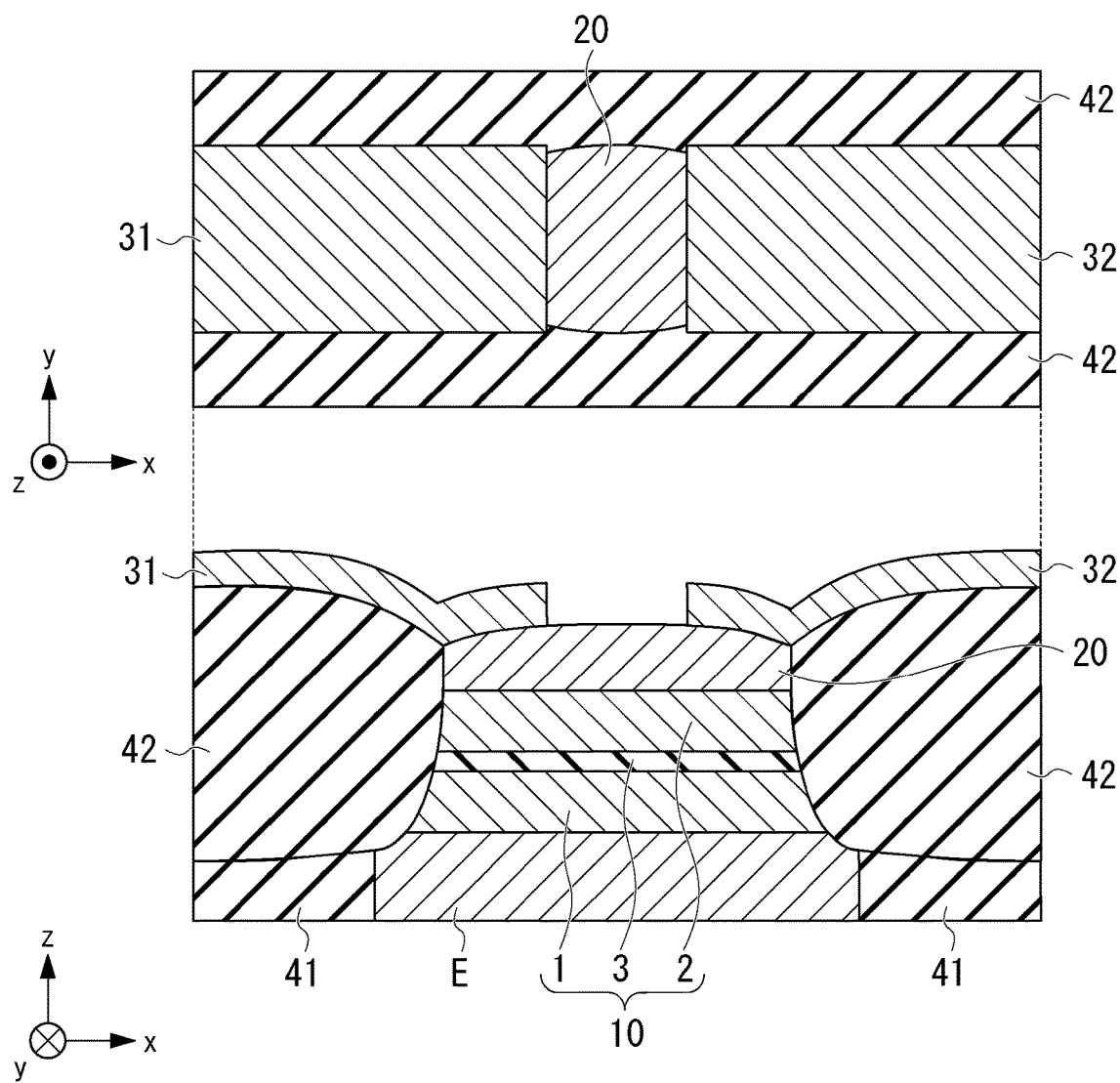
FIG. 10 is a diagram illustrating an example of a method for producing a magnetoresistance effect element according to the first embodiment.

Subsequently, as illustrated in FIG. 10, an unnecessary portion of the metal layer 95 is removed. The metal layer 95 serves as the first wiring 31 and the second wiring 32. Moreover, the first wiring 31 and the second wiring 32 are covered with the insulating layer 43, and thus the magnetoresistance effect element 100 is obtained.

In the magnetoresistance effect element 100 according to the first embodiment, the upper surface 20B of the spin-orbit torque wiring 20 is curved and has excellent heat dissipation. Furthermore, in the magnetoresistance effect element 100 according to the first embodiment, since the surfaces in which the first wiring 31 and the second wiring 32 are in contact with the spin-orbit torque wiring 20 are curved, the contact areas between the first wiring 31, the second wiring 32, and the spin-orbit torque wiring 20 are wide. If the contact areas between these are large, the contact resistances between the first wiring 31, the second wiring 32, and the spin-orbit torque wiring 20 are low and the loss of the write current of the magnetoresistance effect element 100 is reduced. Furthermore, if the contact areas between these are wide, the adhesion between the first wiring 31, the second wiring 32, and the spin-orbit torque wiring 20 is enhanced and the magnetoresistance effect elements 100 is not easily damaged.

Second Embodiment

Figure 11:
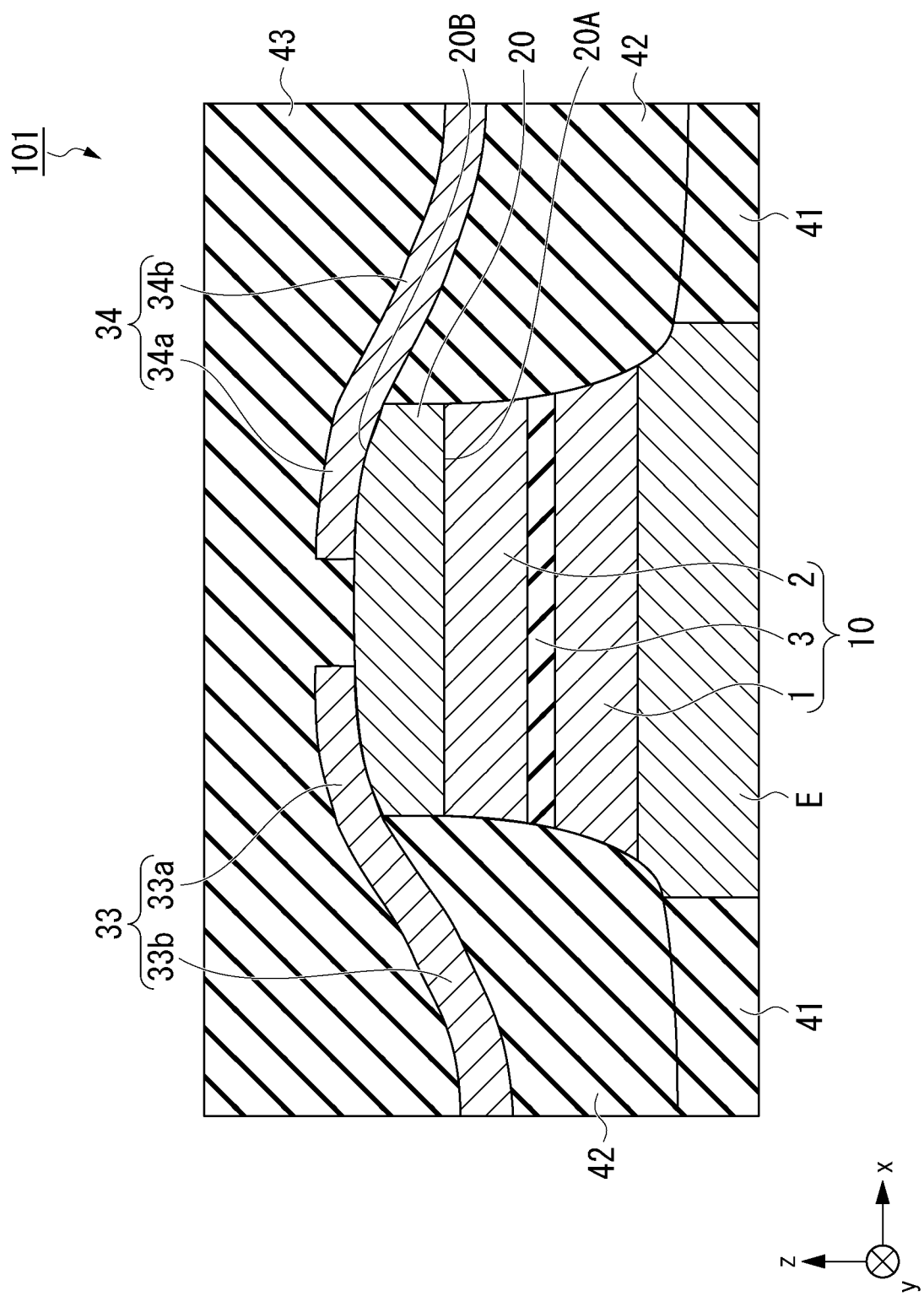
FIG. 11 is a cross-sectional view of a magnetoresistance effect element according to a second embodiment.

FIG. 11 is a cross-sectional view of a magnetoresistance effect element 101 according to a second embodiment. FIG. 11 is a cross section of the magnetoresistance effect element 101 cut in an xz plane passing through a center of a width of a spin-orbit torque wiring 20 in the y direction. The magnetoresistance effect element 101 according to the second embodiment has shapes of a first wiring 33 and a second wiring 34 different from those of the magnetoresistance effect element 100 according to the first embodiment. In the second embodiment, constituent elements that are the same as those in the first embodiment are denoted by the same reference symbols.

The first wiring 33 corresponds to the first wiring 31 according to the first embodiment. The second wiring 34 corresponds to the second wiring 32 according to the first embodiment. The first wiring 33 has a first portion 33a and a second portion 33b. The second wiring 34 has a first portion 34a and a second portion 34b. The first portions 33a and 34a are portions of a spin-orbit torque wiring 20 in contact with an upper surface 20B. The second portions 33b and 34b are portions other than the first portions 33a and 34a.

The second portions 33b and 34b extend toward a laminate body 10 side in the z direction with respect to a lower surface 20A of the spin-orbit torque wiring 20. It is possible to change a direction in which the second portions 33b and 34b extend by adjusting a thickness of an insulating layer 42 to be laminated as illustrated in FIG. 8. The second portions 33b and 34b extend downward from, for example, the first portions 33a and 34a, respectively. If the second portions 33b and 34b extend toward the laminate body 10 side, it is possible to efficiently dissipate the heat generated in the laminate body 10. Furthermore, when the second portions 33b and 34b contain a magnetic material, the leakage magnetic field from the magnetic material is easily applied to a second ferromagnetic layer 2.

The magnetoresistance effect element 101 according to the second embodiment has the same effect as the magnetoresistance effect element 100 according to the first embodiment.

Third Embodiment

Figure 12:
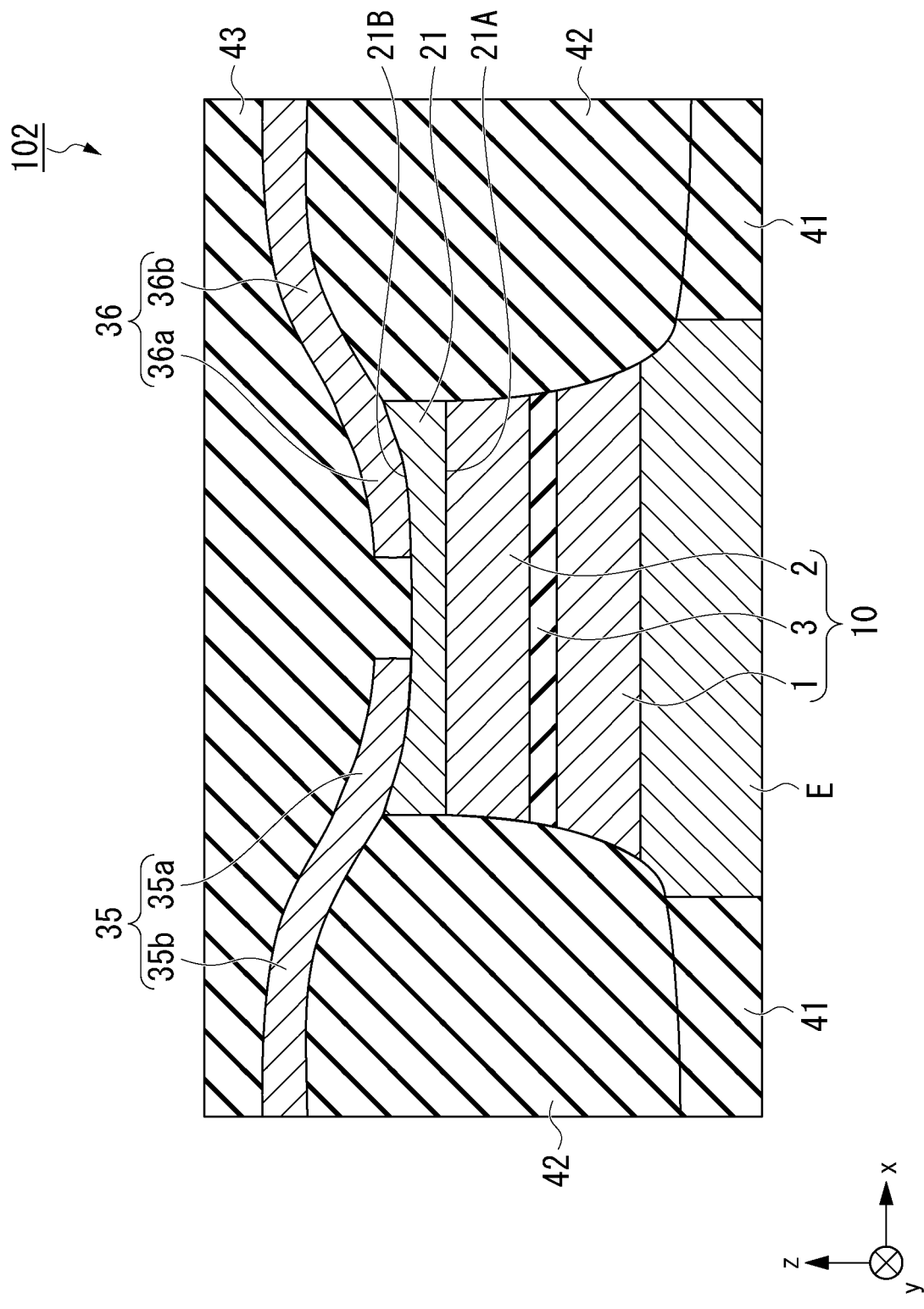
FIG. 12 is a cross-sectional view of a magnetoresistance effect element according to a third embodiment.

FIG. 12 is a cross-sectional view of a magnetoresistance effect element 102 according to a third embodiment. FIG. 12 is a cross section of the magnetoresistance effect element 102 cut in the xz plane passing through a center of a width of a spin-orbit torque wiring 21 in the y direction. The magnetoresistance effect element 102 according to the third embodiment has shapes of the spin-orbit torque wiring 21, a first wiring 35, and a second wiring 36 different from those of the magnetoresistance effect element 100 according to the first embodiment. Constituent elements in the third embodiment that are the same as those of the first embodiment will be denoted by the same reference symbols.

An upper surface 21B of the spin-orbit torque wiring 21 is curved in the x direction. The upper surface 21B is a surface opposite to a lower surface 21A of the spin-orbit torque wiring 21 on the laminate body 10 side.

The upper surface 21B is curved in the x direction, for example, at a position in which the upper surface 21B and the laminate body 10 overlap in the z direction. The upper surface 21B is curved in a bowl shape so that a center in the x direction approaches the lower surface 21A. A thickness of the spin-orbit torque wiring 21 varies depending on a position in the x direction. For example, a thickness of the spin-orbit torque wiring 21 at a center of the spin-orbit torque wiring 21 in the x direction is thinner than a thickness of the spin-orbit torque wiring 21 at a first end of the spin-orbit torque wiring 21. The upper surface 21B is symmetrical in the x direction, for example, with respect to the center of the spin-orbit torque wiring 21 in the x direction.

If the thickness of the spin-orbit torque wiring 21 decreases toward the center in the x direction, a sudden change in write current density in the spin-orbit torque wiring 21 can be minimized. A sudden change in current density is one of the causes of current loss.

The first wiring 35 corresponds to the first wiring 31 according to the first embodiment. The second wiring 36 corresponds to the second wiring 32 according to the first embodiment. The first wiring 35 has a first portion 35a and a second portion 35b. The second wiring 36 has a first portion 36a and a second portion 36b. The first portions 35a and 36a are portions of the spin-orbit torque wiring 21 in contact with the upper surface 21B. The second portions 35b and 36b are portions other than the first portions 35a and 36a.

The second portions 35b and 36b extend toward the spin-orbit torque wiring 21 side in the z direction with respect to the lower surface 21A of the spin-orbit torque wiring 21. The second portions 35b and 36b extend upward from, for example, the first portions 35a and 36a, respectively.

The magnetoresistance effect element 102 according to the third embodiment has the same effect as the magnetoresistance effect element 100 according to the first embodiment.

Fourth Embodiment

Figure 13:
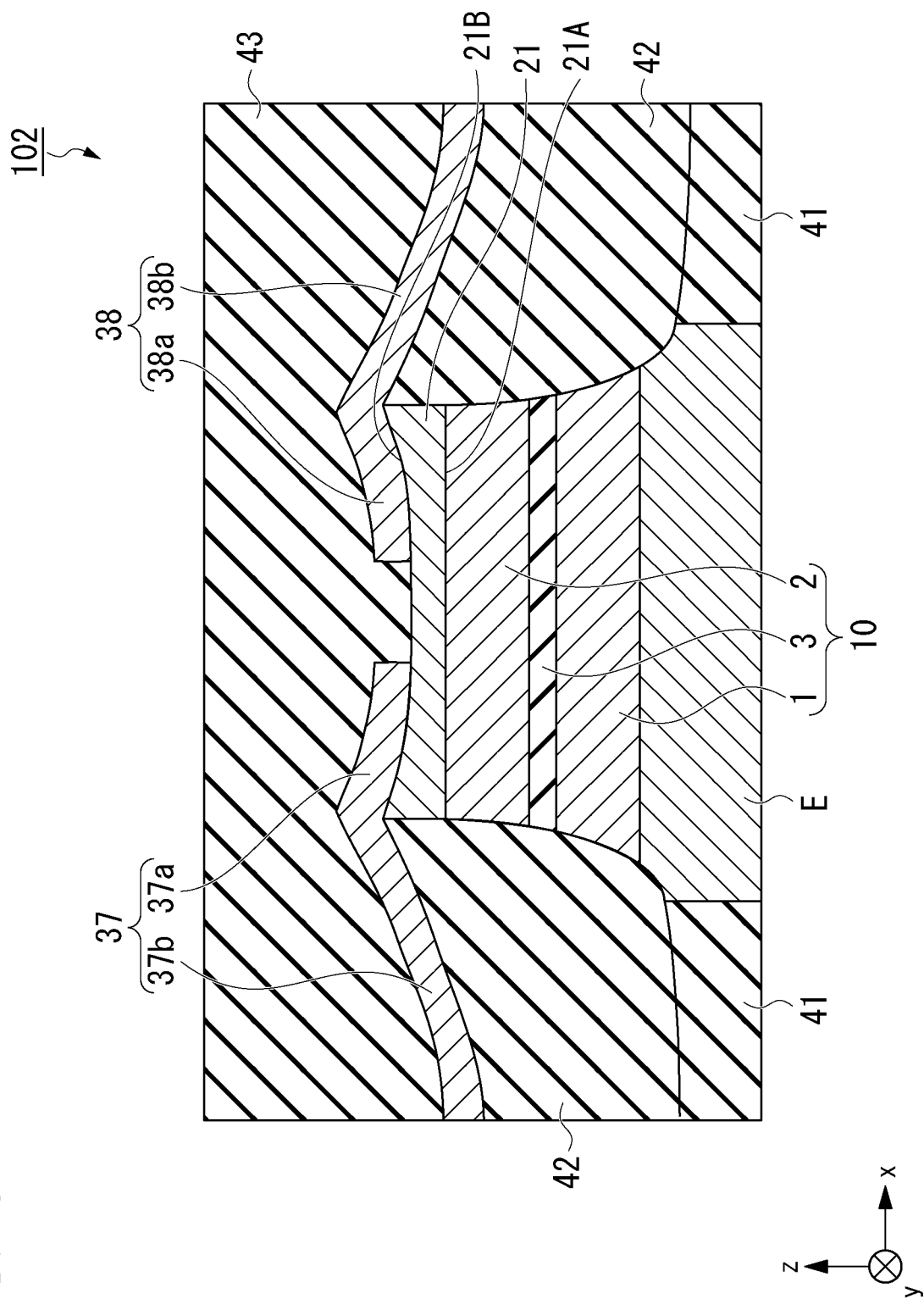
FIG. 13 is a cross-sectional view of a magnetoresistance effect element according to a fourth embodiment.

FIG. 13 is a cross-sectional view of a magnetoresistance effect element 103 according to a fourth embodiment. FIG. 13 is a cross section of the magnetoresistance effect element 103 cut in the xz plane passing through a center of a width of a spin-orbit torque wiring 21 in the y direction. The magnetoresistance effect element 103 according to the fourth embodiment has shapes of a first wiring 37 and a second wiring 38 different from those of the magnetoresistance effect element 102 according to the third embodiment. Constituent elements in the fourth embodiment that are the same as those in the third embodiment will be denoted by the same reference symbols.

The first wiring 37 corresponds to the first wiring 31 according to the first embodiment. The second wiring 38 corresponds to the second wiring 32 according to the first embodiment. The first wiring 37 has a first portion 37a and a second portion 37b. The second wiring 38 has a first portion 38a and a second portion 38b. The first portions 37a and 38a are portions of the spin-orbit torque wiring 21 in contact with the upper surface 21B. The second portions 37b and 38b are portions other than the first portions 37a and 38a.

The second portions 37b and 38b extend toward the laminate body 10 side in the z direction with respect to the lower surface 21A of the spin-orbit torque wiring 21. The second portions 37b and 38b extend downward from, for example, the first portions 37a and 38a, respectively.

The magnetoresistance effect element 103 according to the fourth embodiment has the same effect as the magnetoresistance effect element 100 according to the first embodiment.

Fifth Embodiment

Figure 14:
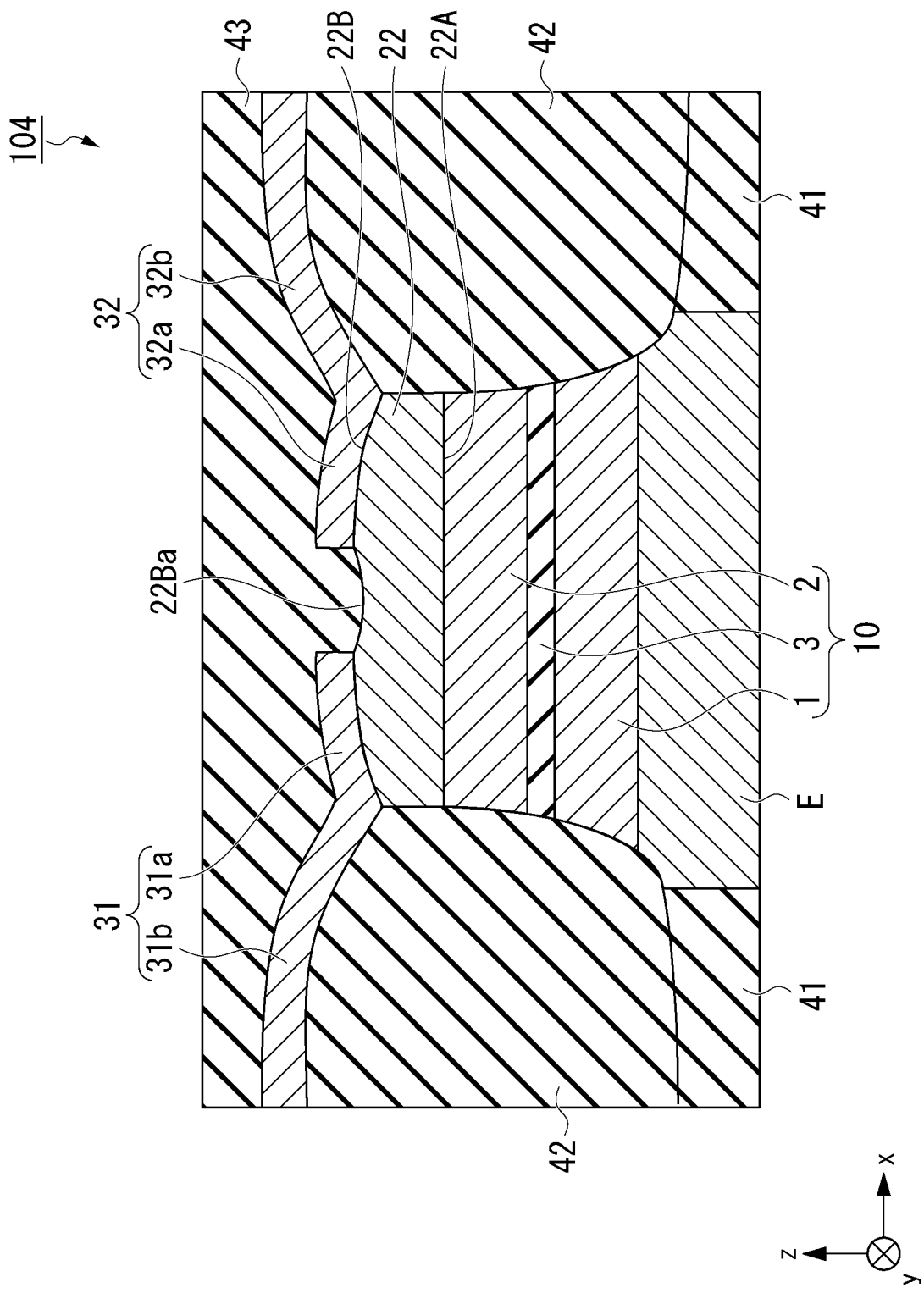
FIG. 14 is a cross-sectional view of a magnetoresistance effect element according to a fifth embodiment.

FIG. 14 is a cross-sectional view of a magnetoresistance effect element 104 according to a fifth embodiment. FIG. 14 is a cross section of the magnetoresistance effect element 104 cut in the xz plane passing through a center of a width of a spin-orbit torque wiring 22 in the y direction. The magnetoresistance effect element 104 according to the fifth embodiment has shapes of the spin-orbit torque wiring 22 different from those of the magnetoresistance effect element 100 according to the first embodiment. Constituent elements in the fifth embodiment that are the same as those of the first embodiment will be denoted by the same reference symbols.

The spin-orbit torque wiring 22 is different from the spin-orbit torque wiring 20 in that a recess portion 22Ba is formed in an upper surface 22B. The upper surface 22B is a surface opposite to a lower surface 22A of the spin-orbit torque wiring 22 on the laminate body 10 side. The recess portion 22Ba is located at a position in which the recess portion 22Ba, the first wiring 31, and the second wiring 32 do not overlap when viewed from the z direction.

The magnetoresistance effect element 104 according to the fifth embodiment has the same effect as the magnetoresistance effect element 100 according to the first embodiment. Furthermore, when the spin-orbit torque wiring 22 has the recess portion 22Ba, the magnetoresistance effect element 104 has a large surface area of the spin-orbit torque wiring 22 and has excellent heat dissipation. In addition, when the spin-orbit torque wiring 22 has the recess portion 22Ba, the magnetoresistance effect element 104 has a high current density of an electric current flowing in the spin-orbit torque wiring 22 and has a high write efficiency.

Sixth Embodiment

Figure 15:
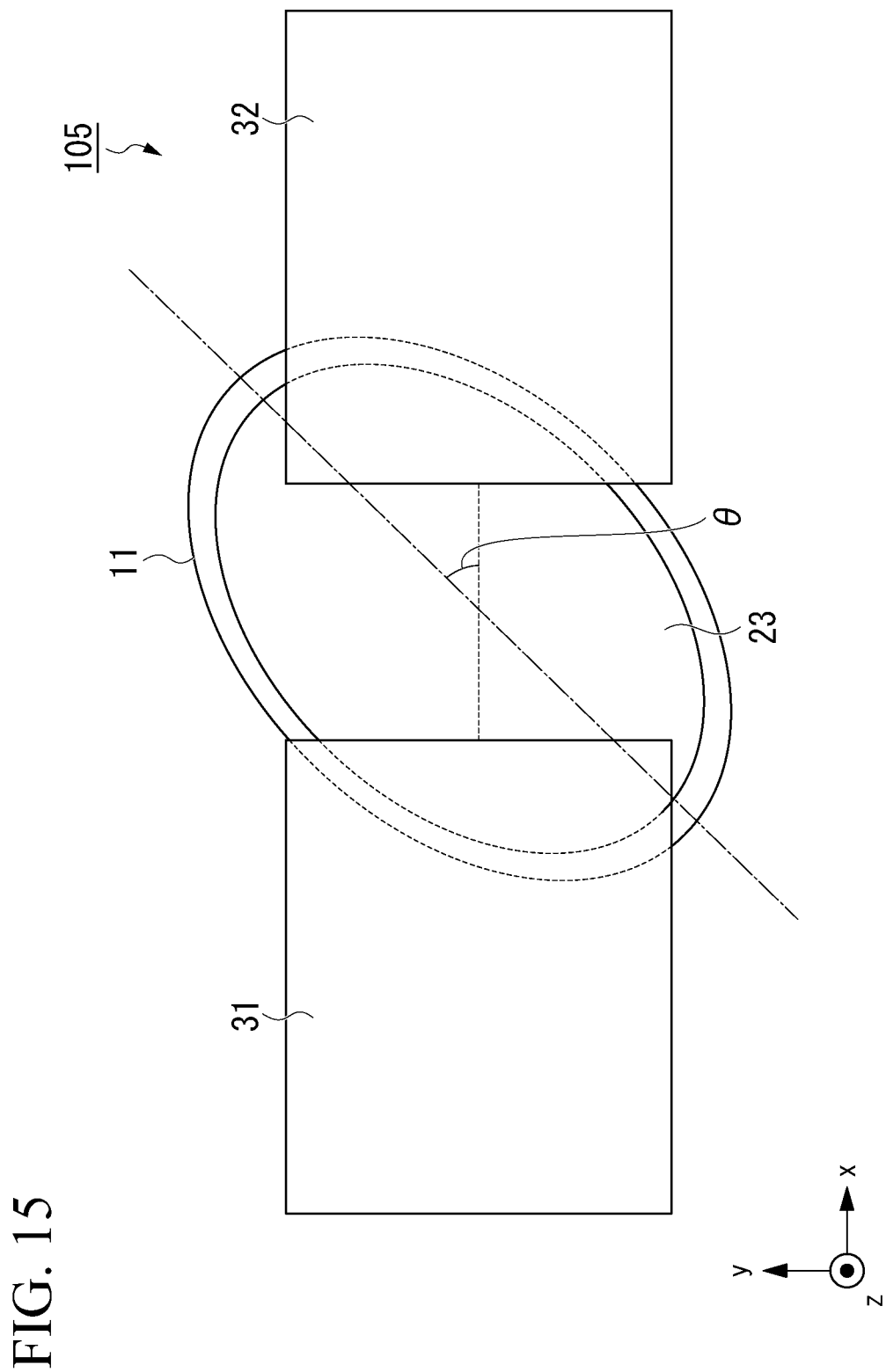
FIG. 15 is a plan view of a magnetoresistance effect element according to a sixth embodiment.

FIG. 15 is a plan view of a magnetoresistance effect element 105 according to a sixth embodiment. A positional relationship of a laminate body 11 and a spin-orbit torque wiring 23 with a first wiring 31 and a second wiring 32 in the magnetoresistance effect element 105 according to the sixth embodiment is different from that of the magnetoresistance effect element 100 according to the first embodiment. Constituent elements in the sixth embodiment that are the same as those of the first embodiment will be denoted by the same reference symbols.

The laminate body 11 and the spin-orbit torque wiring 23 are different from the laminate body 10 and the spin-orbit torque wiring 20, respectively, in that a long axis is tilted at an inclination angle θ with respect to the x direction. The first ferromagnetic layer 1 and the second ferromagnetic layer 2 have, for example, an easy-to-magnetize axis in a long axis direction of the laminate body 11.

An upper surface of the spin-orbit torque wiring 23 is curved in the long axis direction. The shortest direction between the first wiring 31 and the second wiring 32 is, for example, tilted with respect to a direction in which the spin-orbit torque wiring 23 is curved.

A write current flows between the first wiring 31 and the second wiring 32. A direction of spins injected into the second ferromagnetic layer 2 using the write current is tilted with respect to a magnetization orientation direction of the second ferromagnetic layer 2. If an orientation direction of spins injected into the second ferromagnetic layer 2 is tilted with respect to the magnetization orientation direction of the second ferromagnetic layer 2, the reversal symmetry of the magnetization is broken and the magnetization of the second ferromagnetic layer 2 is easily reversed. The magnetoresistance effect element 105 can also reverse the magnetization in the absence of a magnetic field.

The magnetoresistance effect element 105 according to the sixth embodiment has the same effect as the magnetoresistance effect element 100 according to the first embodiment.

Although the magnetoresistance effect element according to the present invention has been described above with reference to some embodiments, additions, omissions, replacements, and other modifications of the constitution are possible without departing from the gist of the present invention.

Figure 16:
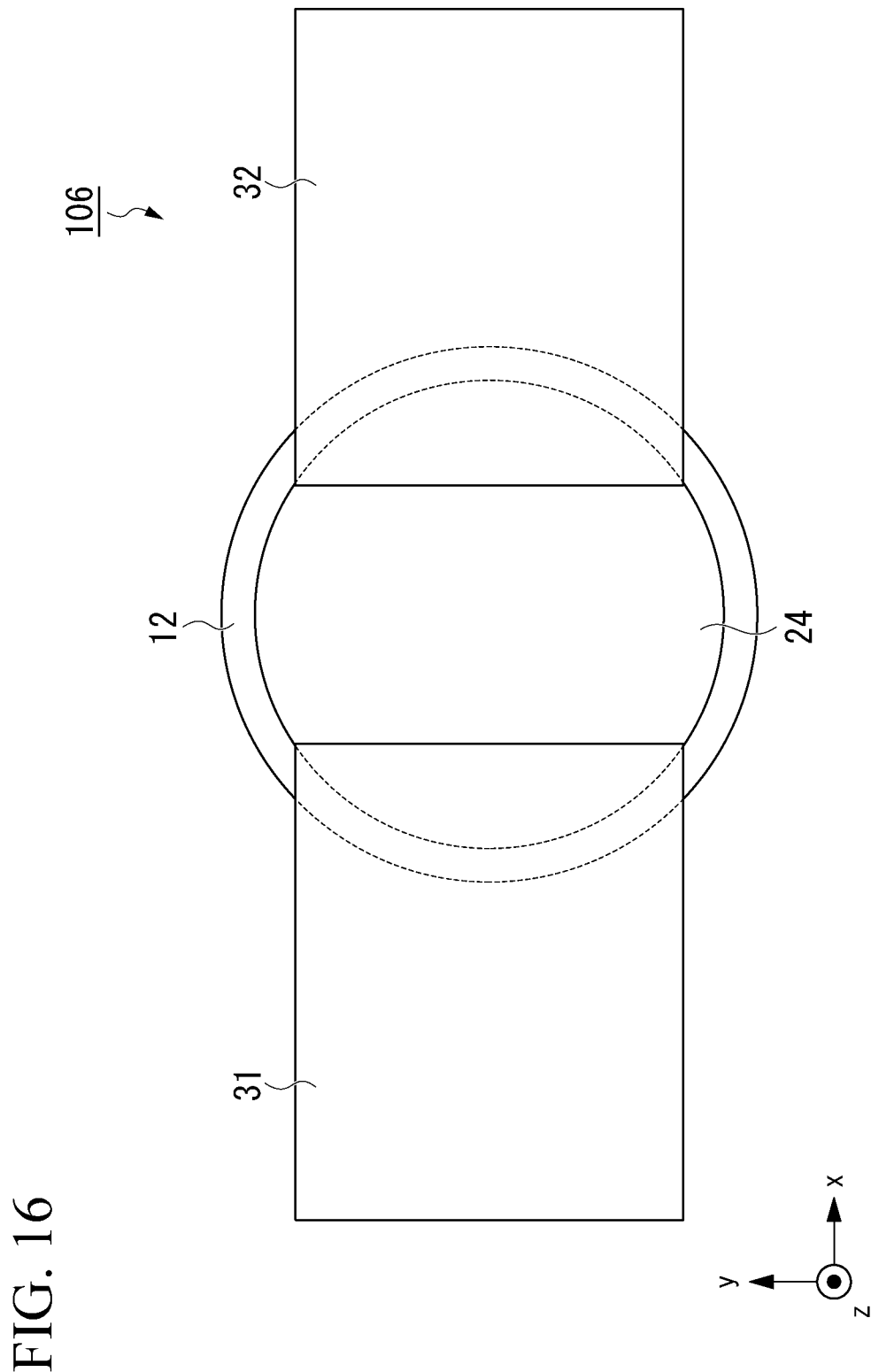
FIG. 16 is a plan view of a magnetoresistance effect element according to a first modified example.
Figure 17:
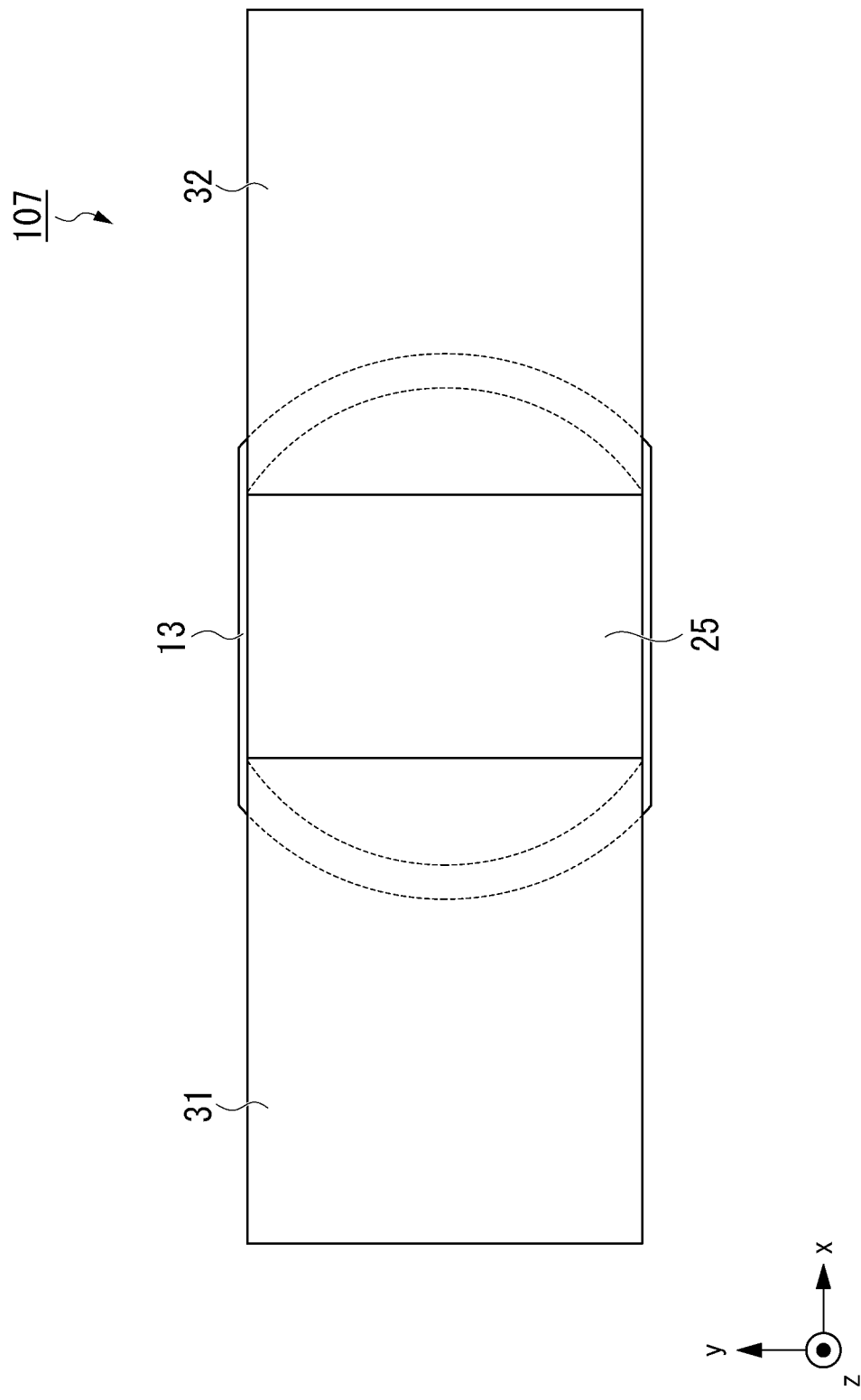
FIG. 17 is a plan view of a magnetoresistance effect element according to a second modified example.

For example, shapes of a laminate body and a spin-orbit torque wiring in the z direction when viewed in plan view may not be elliptical. For example, as in a magnetoresistance effect element 106 illustrated in FIG. 16, shapes of a laminate body 12 and a spin-orbit torque wiring 24 in the z direction when viewed in plan view may be circular. Furthermore, for example, as in a magnetoresistance effect element 107 illustrated in FIG. 17, shapes of a laminate body 13 and a spin-orbit torque wiring 25 in the z direction when viewed in plan view may have an indeterminate form. The magnetoresistance effect element 107 can be obtained by simultaneously removing parts of a laminate body and a spin-orbit torque wiring in the y direction when a metal layer 95 (refer to FIG. 9) is processed in the y direction.

Figure 18:
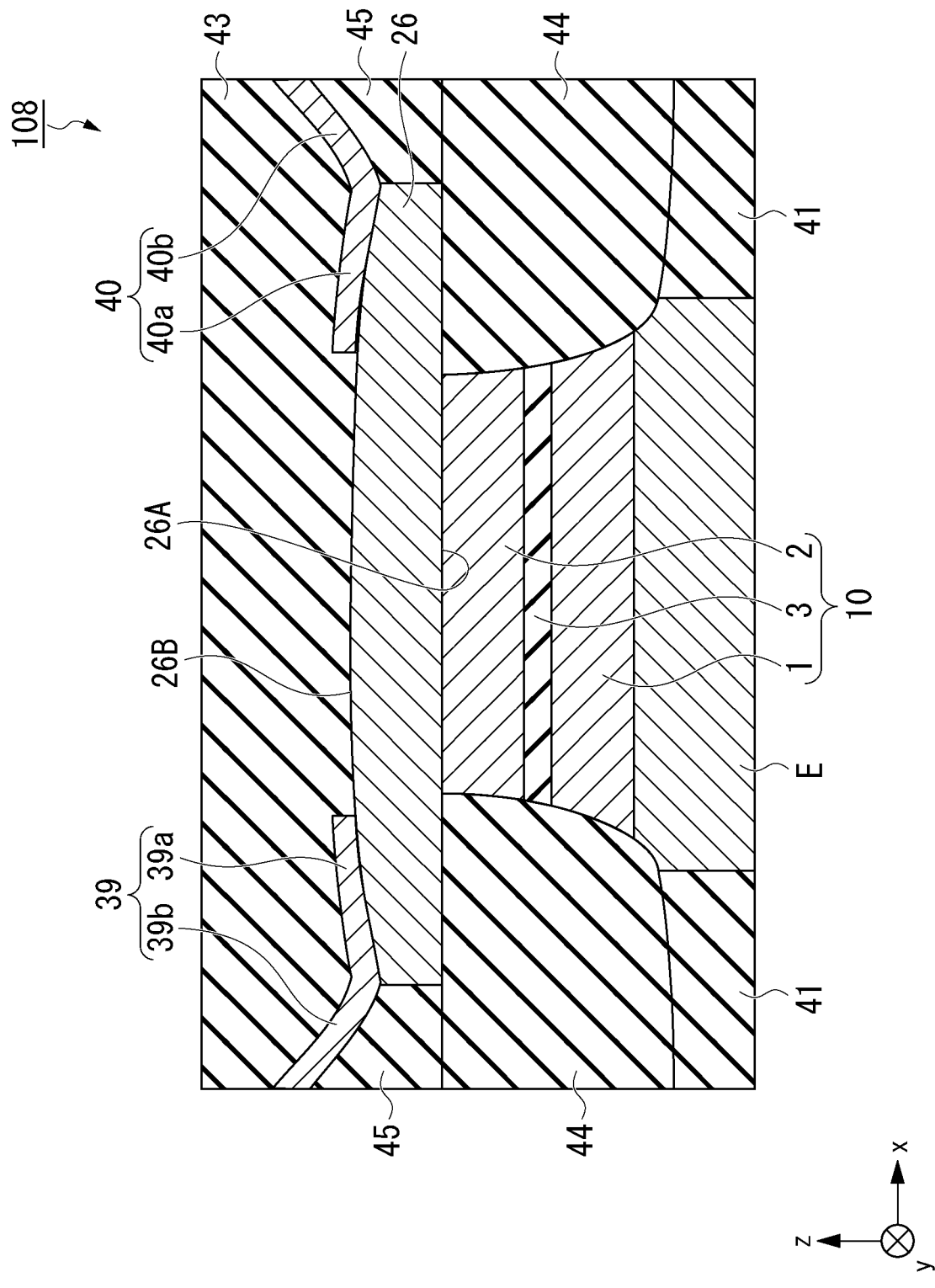
FIG. 18 is a cross-sectional view of a magnetoresistance effect element according to a third modified example.

Also, for example, as in a magnetoresistance effect element 108 illustrated in FIG. 18, a length of a spin-orbit torque wiring 26 in the x direction may be longer than a length of a laminate body 10 in the x direction. A magnetoresistance effect element 108 can be obtained by separately producing the laminate body 10 and the spin-orbit torque wiring 26.

The magnetoresistance effect element 108 is surrounded by insulating layers 41, 44, 45, and 43. The insulating layer 44 surrounds the laminate body 10. The insulating layer 45 surrounds the spin-orbit torque wiring 26.

Although the preferred embodiments of the present invention have been exemplified above on the basis of the embodiments and the modifications, the present invention is not limited to these embodiments. For example, the characteristic constitutions in the embodiments and the modifications may be applied to other embodiments.

EXPLANATION OF REFERENCES

1 First ferromagnetic layer
2 Second ferromagnetic layer
3 Non-magnetic layer
10, 11, 12, 13 Laminate body
20, 21, 22, 23, 24, 25, 26 Spin-orbit torque wiring
20A, 21A, 22A Upper surface
20B, 21B, 22B Lower surface
22Ba Recess portion
31, 33, 35, 37 First wiring
32, 34, 36, 38 Second wiring
31a, 32a, 33a, 34a, 35a, 36a, 37a, 38a First portion
31b, 32b, 33b, 34b, 35b, 36b, 37b, 38b Second portion
100, 101, 102, 103, 104, 105, 106, 107, 108 Magnetoresistance effect element
200 Magnetic array

What is claimed is:

1. A magnetoresistance effect element, comprising:
   a laminate body including:
      a first ferromagnetic layer;
      a second ferromagnetic layer; and
      a non-magnetic layer located between the first ferromagnetic layer and the second ferromagnetic layer;
   a spin-orbit torque wiring connected to the laminate body, the spin-orbit torque wiring including:
      a first surface in contact with the laminate body; and
      a second surface opposite to the first surface, the second surface being curved in a first direction orthogonal to a lamination direction of the laminate body, the second surface being curved so that a center thereof in the first direction is away from or approaches the first surface; and
   a first wiring and a second wiring connected to different positions on the second surface of the spin-orbit torque wiring,
   wherein a shortest direction is an extension direction of a shortest straight line connecting a first contact surface between the second wiring and the spin-orbit torque wiring and a second contact surface between the first wiring and the spin-orbit torque wiring, and coincides with the first direction, and
   a thickness of the spin-orbit torque wiring at a first end thereof in the first direction is 50% or more and 95% or less of a thickness of the spin-orbit torque wiring at a center thereof in the first direction.

2. The magnetoresistance effect element according to claim 1, wherein the second surface is curved so that the center thereof in the first direction is away from the first surface.

3. The magnetoresistance effect element according to claim 1, wherein the second surface is curved in a second direction orthogonal to the first direction.

4. The magnetoresistance effect element according to claim 1, wherein the spin-orbit torque wiring is symmetrical in the first direction with respect to a center thereof in the first direction.

5. The magnetoresistance effect element according to claim 1, wherein the second surface is curved at a position in which the second surface and the laminate body overlap in the lamination direction.

6. The magnetoresistance effect element according to claim 1, wherein an absolute value of a difference between a thickness of the spin-orbit torque wiring at a first end thereof in the first direction and a thickness of the spin-orbit torque wiring at a center thereof in the first direction is 3% or more and 30% or less of half a length of the spin-orbit torque wiring in the first direction.

7. The magnetoresistance effect element according to claim 1, wherein the first wiring extends from a portion of the first wiring connected to the second surface toward the laminate body side with respect to the first surface in the lamination direction.

8. The magnetoresistance effect element according to claim 1, wherein the first wiring and the second wiring contain a magnetic material.

9. A magnetic memory, comprising:
a plurality of the magnetoresistance effect elements according to claim 1.

10. A magnetoresistance effect element, comprising:
a laminate body including:
a first ferromagnetic layer;
a second ferromagnetic layer; and
a non-magnetic layer located between the first ferromagnetic layer and the second ferromagnetic layer;
a spin-orbit torque wiring connected to the laminate body, the spin-orbit torque wiring including:
a first surface in contact with the laminate body; and
a second surface opposite to the first surface, the second surface being curved in a first direction orthogonal to a lamination direction of the laminate body, the second surface being curved so that a center thereof in the first direction is away from or approaches the first surface; and
a first wiring and a second wiring connected to different positions on the second surface of the spin-orbit torque wiring,
wherein
a thickness of the spin-orbit torque wiring at a first end thereof in the first direction is different from a thickness of the spin-orbit torque wiring at a center thereof in the first direction,
a length of the spin-orbit torque wiring in a long axis direction is longer than the length in the short axis direction, and
a shortest direction is an extension direction of a shortest straight line connecting a first contact surface between the second wiring and the spin-orbit torque wiring and a second contact surface between the first wiring and the spin-orbit torque wiring, and is tilted with respect to the long axis direction.

11. A magnetoresistance effect element, comprising:
a laminate body including:
a first ferromagnetic layer;
a second ferromagnetic layer; and
a non-magnetic layer located between the first ferromagnetic layer and the second ferromagnetic layer;
a spin-orbit torque wiring connected to the laminate body, the spin-orbit torque wiring including:
a first surface in contact with the laminate body; and
a second surface opposite to the first surface, the second surface being curved in a first direction orthogonal to a lamination direction of the laminate body; and
a first wiring and a second wiring connected to different positions on the second surface of the spin-orbit torque wiring, the first wiring including:
a first portion in contact with the second surface; and
a second portion that does not overlap with the spin-orbit torque wiring in the lamination direction and extends from the first portion in the lamination direction away from the laminate,
wherein a thickness of the spin-orbit torque wiring at a first end thereof in the first direction is different from a thickness of the spin-orbit torque wiring at a center thereof in the first direction.

* * * * *